(12) United States Patent
Mahdavifar et al.

(10) Patent No.: US 9,602,241 B2
(45) Date of Patent: Mar. 21, 2017

(54) COMPUTING SYSTEM WITH POLAR PROCESSING MECHANISM AND METHOD OF OPERATION THEREOF

(71) Applicant: Samsung Electronics Co., Ltd., Suwon-si, Gyeonggi-Do (KR)

(72) Inventors: Hessam Mahdavifar, San Diego, CA (US); Mostafa El-Khamy, San Diego, CA (US); Jungwon Lee, San Diego, CA (US); Inyup Kang, San Diego, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/485,598

(22) Filed: Sep. 12, 2014

(65) Prior Publication Data

US 2015/0188666 A1 Jul. 2, 2015

Related U.S. Application Data

(60) Provisional application No. 61/922,366, filed on Dec. 31, 2013.

(51) Int. Cl.
*H04L 27/00* (2006.01)
*H04L 1/00* (2006.01)
*H04B 7/10* (2017.01)

(52) U.S. Cl.
CPC ............ *H04L 1/0052* (2013.01); *H04B 7/10* (2013.01); *H04L 1/0041* (2013.01); *H04L 1/0045* (2013.01); *H04L 1/0054* (2013.01); *H04L 1/0057* (2013.01)

(58) Field of Classification Search
CPC . H04L 1/0052; H04L 27/2626; H04L 1/0054; H04L 1/0057; H04L 1/0045; H04L 1/0041
USPC ........................................................ 375/295
See application file for complete search history.

(56) References Cited

U.S. PATENT DOCUMENTS

| | | | | |
|---|---|---|---|---|
| 4,039,961 A * | 8/1977 | Ishio et al. | ..................... | 329/308 |
| 5,659,578 A * | 8/1997 | Alamouti et al. | ............ | 375/261 |
| 5,943,361 A * | 8/1999 | Gilhousen et al. | ........... | 375/142 |
| 7,209,524 B2 * | 4/2007 | Chen | ............................ | 375/295 |
| 7,751,621 B1 * | 7/2010 | Jacobsen | ...................... | 382/173 |
| 8,245,116 B2 | 8/2012 | Orlik et al. | | |
| 8,347,186 B1 | 1/2013 | Arikan | | |
| 2002/0051499 A1 * | 5/2002 | Cameron et al. | ............ | 375/295 |
| 2002/0090035 A1 * | 7/2002 | Seshadri et al. | .............. | 375/265 |

(Continued)

OTHER PUBLICATIONS

Arikan, Channel polarization: A method for constructing capacity-achieving codes, IEEE International Symposium on Information Theory, 2008 ISIT Jul. 6-11, 2008 pp. 1173-1177.*

(Continued)

*Primary Examiner* — Juan A Torres
(74) *Attorney, Agent, or Firm* — IP Investment Law Group

(57) ABSTRACT

A computing system includes: an inter-device interface configured to communicate content; and a communication unit, coupled to the inter-device interface, configured to process the content based on a polar communication mechanism utilizing multiple processing dimensions for communicating the content, including: generating a node result with a first orthogonal mechanism, and processing the node result from the first orthogonal mechanism with a second orthogonal mechanism.

20 Claims, 5 Drawing Sheets

(56) References Cited

U.S. PATENT DOCUMENTS

| | | | |
|---|---|---|---|
| 2006/0176977 A1* | 8/2006 | Jafarkhani et al. | 375/298 |
| 2007/0290749 A1* | 12/2007 | Woo et al. | 330/149 |
| 2012/0023385 A1 | 1/2012 | Scouarnec et al. | |
| 2012/0054576 A1 | 3/2012 | Gross et al. | |
| 2013/0111291 A1 | 5/2013 | Ma | |
| 2013/0117344 A1 | 5/2013 | Gross et al. | |
| 2013/0254466 A1 | 9/2013 | Jian et al. | |
| 2013/0283116 A1 | 10/2013 | Arikan | |
| 2013/0283128 A1 | 10/2013 | Lee et al. | |
| 2014/0169492 A1 | 6/2014 | Mahdavifar et al. | |

OTHER PUBLICATIONS

Arikan, "Channel polarization: A method for constructing capacity-achieving codes for symmetric binary-input memoryless channels", Jul. 2009, IEEE Transactions on Information Theory, Year: 2009, vol. 55, Issue: 7 pp. 3051-3073.*

Erdal Arikan, "Channel polarization: A method for constructing capacity-achieving codes for symmetric binary-input memoryless channels". IEEE Transactions on Information Theory, vol. 55, No. 7, pp. 3051-3073, Jul. 2009.

I. Tal and A. Vardy, "List decoding of polar codes", Proc. IEEE ISIT, Saint Petersburg, Russia, 2011.

M.Gal and L.Frydman, "Ultrafast Multidimensional NMR: Principles and Practice of Single-Scan Methods", Weizmann Institute of Science, eMagRes, Dec. 2008.

Norbert Stolte, 2002, Recursive Codes with the Plotkin-Construction and Their Decoding, Original Title: Rekursive Codes mit der Plotkin-Konstruktion und ihre Decodierung, PhD thesis, TU Darmstadt, Chapter 5, 6.1 and 7.

* cited by examiner

COMPUTING SYSTEM WITH POLAR PROCESSING MECHANISM AND METHOD OF OPERATION THEREOF

CROSS-REFERENCE TO RELATED APPLICATION(S)

This application claims the benefit of U.S. Provisional Patent Application Ser. No. 61/922,366 filed Dec. 31, 2013, and the subject matter thereof is incorporated herein by reference thereto. This application further incorporates by reference U.S. patent application Ser. No. 14/108,981 filed Dec. 17, 2013.

TECHNICAL FIELD

An embodiment of the present invention relates generally to a computing system, and more particularly to a system with polar processing mechanism.

BACKGROUND

Modern consumer and industrial electronics, especially devices such as cellular phones, navigations systems, portable digital assistants, and combination devices, are providing increasing levels of functionality to support modern life including mobile communication. Research and development in the existing technologies can take a myriad of different directions.

The increasing demand for information in modern life requires users to access information at any time, at increasing data rates. However, telecommunication signals used in mobile communication effectively experience various types of hindrances from numerous sources, as well as computational complexities rising from numerous possible formats for communicated information, which affect the quality and speed of the accessible data.

Thus, a need still remains for a computing system with polar processing mechanism. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a computing system, including: an inter-device interface configured to communicate content; and a communication unit, coupled to the inter-device interface, configured to process the content based on a polar communication mechanism utilizing multiple processing dimensions for communicating the content, including: generating a node result with a first orthogonal mechanism, and processing the node result from the first orthogonal mechanism with a second orthogonal mechanism.

An embodiment of the present invention provides a method of operation of a computing system including: communicating content; processing the content based on a polar communication mechanism utilizing multiple processing dimensions for communicating the content, including: generating a node result with a first orthogonal mechanism, and processing the node result from the first orthogonal mechanism with a second orthogonal mechanism.

An embodiment of the present invention provides a non-transitory computer readable medium including instructions for operating a computing system, including: communicating content; processing the content based on a polar communication mechanism utilizing multiple processing dimensions for communicating the content, including: generating a node result with a first orthogonal mechanism, and processing the node result from the first orthogonal mechanism with a second orthogonal mechanism.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
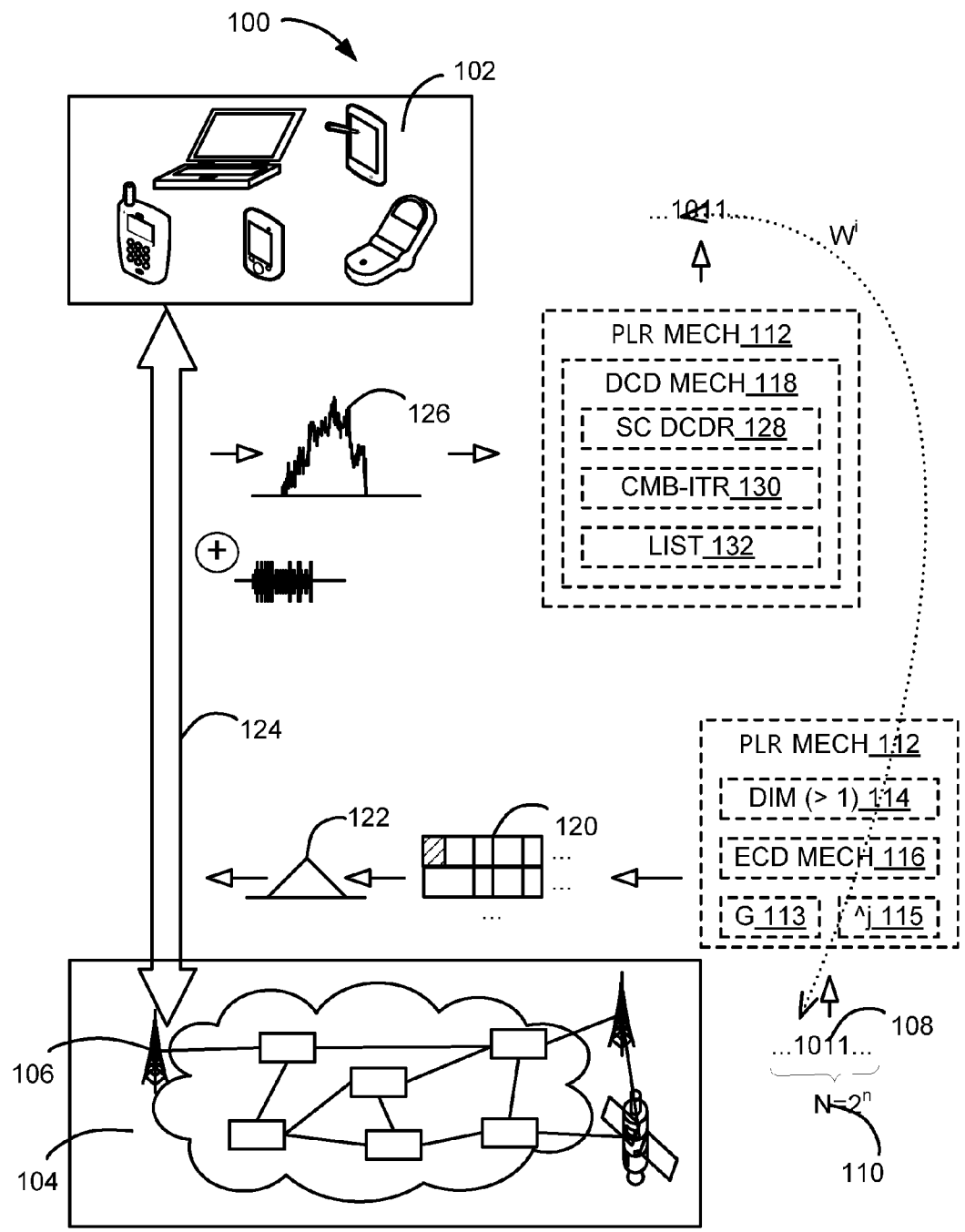
FIG. 1 is a computing system with polar processing mechanism in an embodiment of the present invention.

The following embodiments of the present invention can be used to coordinate multiple communications over multiple access channels. A coordination mechanism communicating coordination profile between multiple transmitter devices can be used to construct messages according to a message construction mechanism. The constructed messages can be transmitted according to a message polarization mechanism common across multiple transmitters.

The transmitted encoded messages can be received. Based on attributes of the received signal, such as communication rate or mutual information, receiving devices can calculate a decoding sequence. The receiving device can further decode the received signals according to the decoding sequence to estimate or recover the originally intended content.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include or be implemented as software, hardware, or a combination thereof in the present invention in accordance with the context in which the term is used. For example, the software can be machine code, firmware, embedded code, and application software. The software can also include a function, a call to a function, a code block, or a combination thereof. Also for example, the hardware can be gates, circuitry, processor, computer, integrated circuit, integrated circuit cores, a pressure sensor, an inertial sensor, a microelectromechanical system (MEMS), passive devices, physical non-transitory memory medium having instructions for performing the software function, a portion therein, or a combination thereof.

The term "processing" as used herein includes manipulating signal and corresponding data, such as filtering, detecting, decoding, assembling data structures, transferring data structures, manipulating data structures, and reading and writing data structures. Data structures are defined to be information arranged as symbols, packets, blocks, files, input data, system generated data, such as calculated or generated data, and program data.

Referring now to FIG. 1, therein is shown a computing system 100 with error handling mechanism in an embodiment of the present invention. The computing system 100 includes a first device 102, such as a mobile device including a cellular phone or a notebook computer, connected to a network 104. The first device 102 can further include a wired device, such as a modem or a router. The first device 102 can further include a circuit or a device within a comprehensive device, such as a portion or circuit specializing in processing information within a storage device or system.

The network 104 is a system of wired or wireless communication devices or means that are connected to each other for enabling communication between devices. For example, the network 104 can include a combination of wires, transmitters, receivers, antennas, towers, stations, repeaters, telephone network, servers, or client devices for a wireless cellular network. The network 104 can also include a combination of routers, cables, computers, servers, and client devices for various sized area networks. Also for example, the network 104 can include a communication bus, a wire, a cable, a wireless connection, or a combination thereof between units within a device.

The computing system 100 can include a second device 106 for directly or indirectly linking and communicating with the first device 102. The network 104 can include or couple to the second device 106. The second device 106 can receive wireless signals from the first device 102, transmit signals to the first device 102, process signals, or a combination thereof. The second device 106 can also relay signals between other base stations, components within the network 104, or a combination thereof.

The first device 102 can be connected to the network 104 through the second device 106. For example, the second device 106 can be a base station, a server, a router, a modem, or a combination thereof. Also for example, the second device 106 can be a communication device or a processing component included or with a cell tower, a wireless router, an antenna, or a combination thereof being used to communicate with, such as by sending signals to or receiving signals from, the first device 102 including a mobile computing device. Also for example, the second device 106 can include a portion or circuit specializing in storing information within the storage device or system.

The first device 102 can connect to and communicate with other devices, such as other mobile devices, servers, computers, telephones, or a combination thereof. For example, the first device 102 can communicate with other devices by transmitting signals, receiving signals, processing signals, or a combination thereof and displaying content of the signals, audibly recreating sounds according to the content of the signals, processing according to the content, such as storing an application or updating an operating system, or a combination thereof.

The second device 106 can be used to wirelessly exchange signals for communication, including voice signals of a telephone call or data representing a webpage and interactions therewith. The second device 106 can also transmit reference signals, training signals, error detection signals, error correction signals, header information, transmission format, protocol information, or a combination thereof.

Based on the communication method, such as code division multiple access (CDMA), orthogonal frequency-division multiple access (OFDMA), Third Generation Partnership Project (3GPP), Long Term Evolution (LTE), or fourth generation (4G) standards, the communication signals can include a reference portion, a header portion, a format portion, an error correction or detection portion, or a combination thereof imbedded in the communicated information. The reference portion, header portion, format portion, error correction or detection portion, or a combination thereof can include a predetermined bit, pulse, wave, symbol, or a combination thereof. The various portions can be embedded within the communicated signals at regular time intervals, frequency, code, or a combination thereof.

For illustrative purposes, the computing system 100 will be described as a communication system with the first device 102 as a user equipment, such as a mobile device, and the second device 106 as a base station or a transmission node. However, it is understood that the computing system 100 can be different, such as a memory system with the first device 102 as a processing portion in a disc drive or a device focusing on processing in a memory system, and the second device 106 as a storage portion in the disc drive or a device focusing on storing in the memory system.

The computing system 100 can process content 108. The content 108 can include data intended for accessing, processing, communicating, or a combination thereof. For example, the second device 106 can communicate the content 108 intended for the first device 102. The content 108 can include data from a transmitting device intended for communication by reproduction or processing at a receiving device. As a more specific example, the content 108 can be a sequence of bits intended for displaying, audibly recreating, executing instructions, storing, or a combination thereof at a receiving device, such as the first device 102.

The content 108 can include a processing length 110. The processing length 110 can include a size or a quantity for information in the content 108. The processing length 110 can include a block length or size. The processing length 110 can be represented as '$N=2^n$'. The content 108, represented as '$u_1^N$', can include uniform independent and identically distributed (i.i.d.) information bits represented as '$u_1, u_2, \ldots, u_N$'.

The computing system 100 can include a polar communication mechanism 112 for communicating the content 108. The polar communication mechanism 112 a method, a process, or a combination thereof for providing linear block error correcting code. The polar communication mechanism 112 can include a set of codes, an alphabet, a rule set, or a combination thereof corresponding to one or a combination bit values for coding, decoding, or a combination thereof for the content 108. The polar communication mechanism 112 can be for error-correction process, error-detection process, or a combination thereof.

The polar communication mechanism 112 can include a channel polarization parameter 113. The channel polarization parameter 113 can be represented as:

$$G = \begin{bmatrix} 1 & 0 \\ 1 & 1 \end{bmatrix}. \quad \text{Equation (1).}$$

The computing system 100 can apply a Kronecker power 115 to the channel polarization parameter 113 to calculate the j-th instance of the Kronecker power 115. The j-th instance of the Kronecker power 115 can be represented as:

$$G^{\otimes(j+1)} = \begin{bmatrix} G^{\otimes j} & 0 \\ G^{\otimes j} & G^{\otimes j} \end{bmatrix}. \quad \text{Equation (2).}$$

The computing system 100 can utilize the polar communication mechanism 112 corresponding to a processing dimension 114. The processing dimension 114 can represent an aspect or a complexity associated with the polar communication mechanism 112. The processing dimension 114 can include a set of values or a portion of an overall process that can be separated or is unique.

The computing system 100 utilizing the polar communication mechanism 112 corresponding to a single instance of the processing dimension 114 can apply the channel polarization parameter 113, the j-th instance of the Kronecker power 115, or a combination thereof directly to the content 108. The computing system 100 utilizing the polar communication mechanism 112 corresponding to a single instance of the processing dimension 114 can be represented as '$u_1^N G^{\otimes j}$'.

The computing system 100 can further utilize a multi-dimensional encoding mechanism 116, a multi-dimensional decoding mechanism 118, or a combination thereof to communicate the content 108. The multi-dimensional encoding mechanism 116 is a method, a process, or a combination thereof for encoding the content 108 utilizing multiple instances of the processing dimension 114 in providing linear block error correcting code.

The multi-dimensional encoding mechanism 116 can represent an m-dimensional polar transformation. The multi-dimensional encoding mechanism 116 can be represent as '$\mathcal{P}^{\overset{m\ times}{2 \times 2 \times \ldots \times 2}}$', The term '$\mathcal{P}$' can represent the polar communication mechanism 112. The multi-dimensional aspect can be represented with the repeating powers applied 'm' number of times, as corresponding to a quantity for the processing dimension 114.

For m-dimensional polar transformation, the input information can be arranged or rearranged to m-dimensional format, such as for a matrix or a data structure. The content 108 can include the m-dimensional format for the multi-dimensional encoding mechanism 116, represented as:

$$u = [u_{i_1, i_2, \ldots, i_n}]_{2 \times \ldots \times 2} \in \mathbb{F}_2^{\overset{m\ times}{2 \times 2 \times \ldots \times 2}}. \quad \text{Equation (3).}$$

The multi-dimensional decoding mechanism 118 is a method, a process, or a combination thereof for decoding and recovering the content 108 utilizing multiple instances of the processing dimension 114 in providing linear block error correcting code. The multi-dimensional encoding mechanism 116 and the multi-dimensional decoding mechanism 118 can utilize multiple instances of the processing dimension 114 orthogonal each other.

The computing system 100 can utilize the multi-dimensional encoding mechanism 116 to generate one or more instances of code word 120. The computing system 100 can generate the code word 120 by applying the channel polarization parameter 113, the Kronecker power 115, or a combination thereof more than once to the content 108 according to the multi-dimensional encoding mechanism 116. The code word 120 can include the content 108 or a portion therein encoded with the multi-dimensional encoding mechanism 116.

The code word 120 can further include error detecting information, header or format information, or a combination thereof. The code word 120 can further include forced zero bits according to the coding mechanism. The code word 120 can further include information or bits rearranged or interleaved according to the coding mechanism.

The computing system 100 can send transmitter signal 122 to communicate the content 108. The transmitter signal 122 can be based on the code word 120. The transmitter signal 122 can include information actually transmitted by a device for communication and having a format for transmission. For example, the first device 102, the second device 106, or a combination thereof can send the transmitter signal 122 based on producing or altering energy levels, currents, voltages, or a combination thereof according to the code word 120 or a derivation thereof.

Also for example, the computing system 100 can send the transmitter signal 122 according to symbols associated with a modulation scheme and corresponding to the code word 120. Also for example, the computing system 100 can use a bit-interleaved coded modulation (BICM) mechanism for communicating between devices.

The transmitter signal 122 can be represented as 'X'. The transmitter signal 122 can traverse a transmission channel 124 and be received at a device as receiver signal 126.

The transmission channel 124 can be wireless, wired, or a combination thereof. The transmission channel 124 can be a direct link between devices, such as between the first device 102 and the second device 106, or can include repeaters, amplifiers, or a combination thereof. For example, the transmission channel 124 can include communication frequency, time slot, packet designation, transmission rate, channel code, or a combination thereof used for transmitting signals between the first device 102 and the second device 106.

The transmission channel 124 can correspond to characteristics including binary-input, memory-less, symmetric capacity, discrete, additive Gaussian modeled, or a combination thereof. As a more specific example, the transmission channel 124 can include 'N' independent copies, as associated with the processing length 110, of a binary input discrete memory-less channel (B-DMC). The independent copies of the transmission channel 124 can split into bit channels. The transmission channel 124 can be represented as 'W' with i-th bit channel denoted by '$W_N^{(i)}$'.

The receiver signal 126 can include information received by a device, such as the first device 102, the second device 106, or a combination thereof, in the communication system 100. The receiver signal 126 can include the transmitter signal 122 that has been altered from traversing the transmission channel 124. The receiver signal 126 can further include noise from the first device 102, the second device 106, or a combination thereof, interference signals from other devices and corresponding channel effects, or a combination thereof. The receiver signal 126 can be represented as 'Y'.

The computing system 100 can process the receiver signal 126 to recover or estimate the code word 120. For example, the first device 102, the second device 106, or a combination thereof can detect, decode, error-correct, error-detect, or a combination thereof for the receiver signal 126 to recover or estimate the code word 120 originally included in the transmitter signal 122. The computing system 100 can use the multi-dimensional decoding mechanism 118 to recover or estimate the code word 120.

The computing system 100 can use the multi-dimensional encoding mechanism 116 and the multi-dimensional decoding mechanism 118 to communicate information using the polar communication mechanism 112 corresponding to multiple instances of the processing dimension 114. The computing system 100 can further use a successive cancellation decoder 128 for processing the content 108.

The computing system 100 can use the successive cancellation decoder 128 for decoding and recovering the content 108. The successive cancellation decoder 128 can include a decoder having a specific method, process, circuit, or a combination thereof for iteratively removing unwanted or undesirable portions of the received signal in decoding for the content 108.

For example, the computing system 100 can include the first device 102 encoding with the multi-dimensional encoding mechanism 116 and transmitting the code word 120 through the transmitter signal 122. The computing system 100 can include the second device 106 receiving the receiver signal 126 corresponding to the transmitter signal 122 and decoding with the multi-dimensional decoding mechanism 118 to recover the content 108. The second device 106 can include the successive cancellation decoder 128.

Also for example, the computing system 100 can include the second device 106 encoding with the multi-dimensional encoding mechanism 116 and transmitting the code word 120 through the transmitter signal 122. The computing system 100 can include the first device 102 receiving the receiver signal 126 corresponding to the transmitter signal 122 and decoding with the multi-dimensional decoding mechanism 118 to recover the content 108. The first device 102 can include the successive cancellation decoder 128.

The computing system 100 can further utilize the polar communication mechanism 112 based on multiple instances of the processing dimension 114 through combined-iterative mechanism 130, list decoding mechanism 132, or a combination thereof. The combined-iterative mechanism 130 is a method or process for determining the content 108 from the receiver signal 126 through repeated processing and interaction between the detection process and the decoding process.

The combined-iterative mechanism 130 can include an iterative detection-decoding (IDD) architecture. The combined-iterative mechanism 130 can include a direct coupling and interaction between a detection process, for recognizing symbols or information from detecting signals, and a decoding process, for recognizing content information from recognized symbols or detected information.

The combined-iterative mechanism 130 can include a feed-forward information from the detection process to the decoding process, a feed-back information from the decoding process to the detection process or a combination thereof. The combined-iterative mechanism 130 can use the result of the detection process for the decoding process, the result of the decoding process for the detection process, or a combination thereof.

The list decoding mechanism 132 is a method or process for determining the content 108 from the receiver signal 126 using adaptive labeling for utilizing a successive parent-child processing architecture. The computing system 100 can process multiple derivations or child nodes consecutively. Paths between the nodes or utilized by the decoding process can change or adapt during the processing of the latter or last node. The computing system 100 can track path labels and process the results accordingly.

For illustrative purposes, the second device 106 is described as transmitting the transmitter signal 122 and the first device 102 is described as receiving and processing the receiver signal 126 to recover the content 108. However, it is understood that the computing system 100 can operate differently. For example, the first device 102 can transmit the transmitter signal 122 and the second device 106 receiving and processing the receiver signal 126 to recover the content 108. Also for example, the transmitter signal 122 and the receiver signal 126 can be communicated and processed between multiple instances of the mobile user equipment, such as the first device 102.

Figure 2:
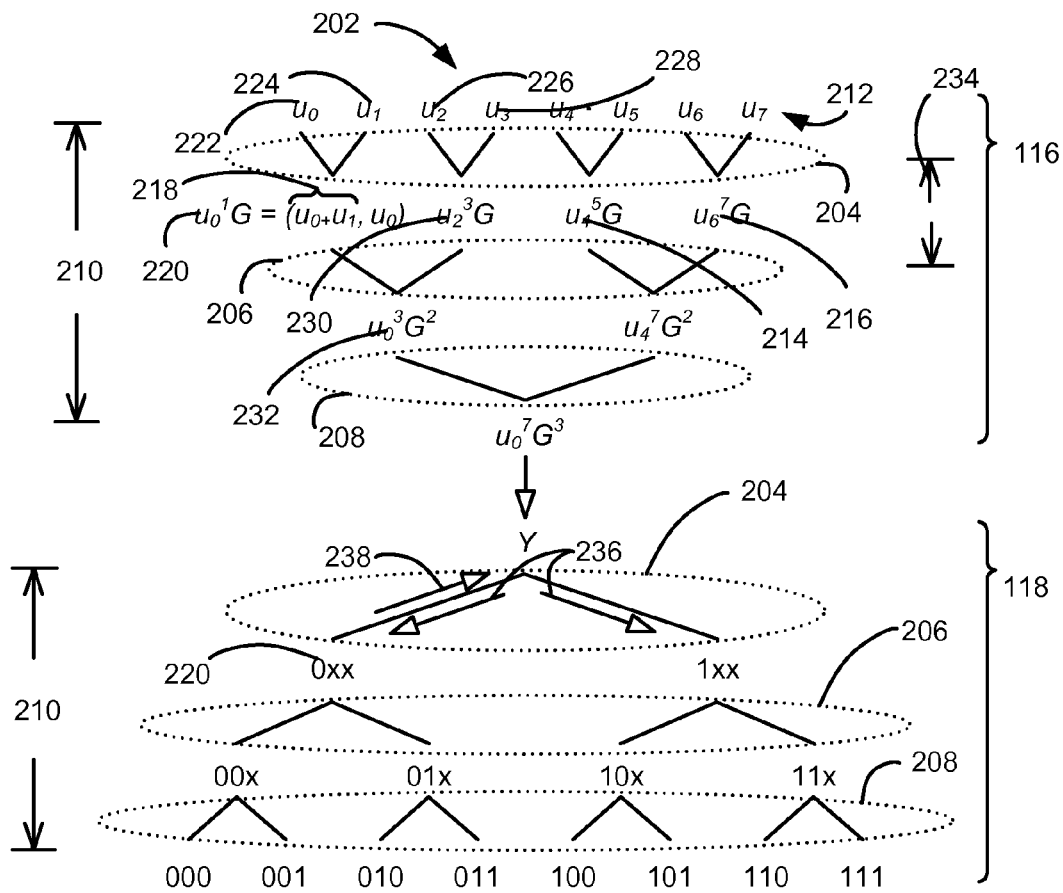
FIG. 2 is an exemplary representation for the polar processing mechanism of FIG. 1 utilizing multiple instances of the dimension of FIG. 1.

Referring now to FIG. 2, therein is shown an exemplary representation for the polar communication mechanism 112 of FIG. 1 utilizing multiple instances of the processing dimension 114 of FIG. 1. The exemplary representation can depict the multi-dimensional encoding mechanism 116, the multi-dimensional decoding mechanism 118, or a combination thereof. The exemplary representation can depict the multi-dimensional encoding mechanism 116, the multi-dimensional decoding mechanism 118, or a combination thereof including a tree architecture 202.

The tree architecture 202 can include a format, an arrangement, an order or sequence, or a combination thereof for incrementally processing information. The tree architecture 202 can include leaves at initial level. The computing system 100 of FIG. 1 can generate one or more instances of node based on processing the leaves. The computing system 100 can combine two or more instances of the leaves in processing to generate each instance of the node.

The computing system 100 can similarly generate one or more instances of subsequent node based on multiple instances of the nodes. The computing system 100 implementing the tree architecture 202 can repeat the process until only one or a predetermined number of nodes result from combining the leaves, intermediate nodes, or a combination thereof.

The computing system 100 can implement the multi-dimensional encoding mechanism 116, the multi-dimensional decoding mechanism 118, or a combination thereof including a first orthogonal mechanism 204 and a second orthogonal mechanism 206. The first orthogonal mechanism 204 and the second orthogonal mechanism 206 are each a method, a process, or a combination thereof for manipulating data or information for communication in association with a unique instance of the processing dimension 114.

The first orthogonal mechanism 204, the second orthogonal mechanism 206, or a combination thereof can be for encoding or decoding the content 108 of FIG. 1 with respect to the transmitter signal 122 of FIG. 1 or the receiver signal 126 of FIG. 1. The first orthogonal mechanism 204 and the second orthogonal mechanism 206 can each manipulate the content 108 along the unique instance of the processing dimension 114.

For example, the first orthogonal mechanism 204 or the second orthogonal mechanism 206 can be for processing the content 108 across a row or in a horizontal direction. Also for example, the second orthogonal mechanism 206 or the first orthogonal mechanism 204 can be for processing the content 108 across a column or in a vertical direction.

The first orthogonal mechanism 204 can be similar to the second orthogonal mechanism 206. For example, the first orthogonal mechanism 204 can be a preceding iteration and the second orthogonal mechanism 206 can be a subsequent iteration. Also for example the second orthogonal mechanism 206 can process a result from the first orthogonal mechanism 204 in a same or similar way.

The computing system 100 can implement the multi-dimensional encoding mechanism 116, the multi-dimensional decoding mechanism 118, or a combination thereof including one or more instances of a further orthogonal mechanism 208 according to a coding depth 210. The further orthogonal mechanism 208 is a method, a process, or a combination thereof for manipulating data or information for communication in association with a unique instance of the processing dimension 114 different from the first orthogonal mechanism 204 and the second orthogonal mechanism 206.

The coding depth 210 is a description of complexity or layers utilized by the polar communication mechanism 112. The coding depth 210 can include a total number of unique instances of the processing dimension 114 processed by the polar communication mechanism 112.

For example, the polar communication mechanism 112 utilizing the first orthogonal mechanism 204 and the second orthogonal mechanism 206 can be two. Also for example, the polar communication mechanism 112 utilizing the first orthogonal mechanism 204, the second orthogonal mechanism 206, and one instance of the further orthogonal mechanism 208 can be three.

The coding depth 210 can be associated with the processing length 110 of FIG. 1. The coding depth 210 can be represented as 'n' for 'N=$2^n$'. For example, the coding depth 210 of three levels or iterations can correspond to the processing length of 8 or a range of 0-7. Also for example, the coding depth 210 of two levels or iterations can correspond to the processing length of 4 or a range of 0-3. As a more specific example, the coding depth 210 can be associated with a number of bits.

For illustrative purposes, the computing system 100 is described using the coding depth of 2 or 3. However, it is understood that the coding depth 210 for the computing system 100 can be any number exceeding 3.

As an illustrative example, the computing system 100 can implement the multi-dimensional encoding mechanism 116 by applying the first orthogonal mechanism 204 to content information portions 212. The content information portions 212 can include groupings or segments within the content 108. For example, the content information portions 212 can each be a unique subset or grouping of information, such as bits or symbols.

Figure 3:
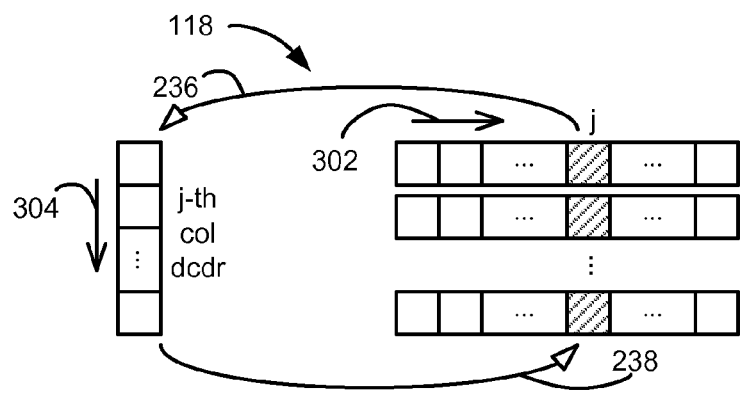
FIG. 3 is an exemplary representation for the multi-dimensional decoding mechanism.

Continuing with the example, the exemplary instance of the content 108 as shown in FIG. 3 can include the processing length 110 of 'N=$8=2^3$'. The content 108 can include '$u_0^7=u_0, u_1, \ldots, u_7$' or '$u_1^8=u_1, u_2, \ldots, u_8$'. The content information portions 212 can include '$u_0, u_1, \ldots, u_7$' or '$u_1, u_2, \ldots, u_8$'.

The computing system 100 implementing the multi-dimensional encoding mechanism 116 can apply the first orthogonal mechanism 204 for the multi-dimensional encoding mechanism 116 to first child information 214 and second child information 216. The first child information 214 and the second child information 216 are each a unique instance of input for the polar communication mechanism 112 utilizing multiple instances of the processing dimension 114. The first child information 214 can be represented as '$u_{1st}$', and the second child information 216 can be represented as '$u_{2nd}$'.

For example, the first child information 214 and the second child information 216 can include unique portions of the content 108, a derivation thereof, or a combination thereof as inputs for the first orthogonal mechanism 204, the second orthogonal mechanism 206, the further orthogonal mechanism 208, or a combination thereof. Also for example, the first child information 214 and the second child information 216 can include information of differing unique types serving as basis for producing or determining a processing output for the first orthogonal mechanism 204, the second orthogonal mechanism 206, the further orthogonal mechanism 208, or a combination thereof.

The computing system 100 can calculate combined child information 218 according to the first orthogonal mechanism 204, the second orthogonal mechanism 206, the further orthogonal mechanism 208, or a combination thereof for the multi-dimensional encoding mechanism 116. The combined child information 218 is a processing result based on combining the first child information 214 and the second child information 216.

The combined child information 218 can be calculated according to an equation, a process, a method, or a combination thereof predetermined by the computing system 100. As a specific example, the combined child information 218 can be a sum or a product of the first child information 214 and the second child information 216.

The computing system 100 can generate a node result 220 corresponding to the first child information 214 and the second child information 216 based on the multi-dimensional encoding mechanism 116. The node result 220 is a processing result corresponding to a set of unique inputs. The node result 220 can be an output result from the first orthogonal mechanism 204, the second orthogonal mechanism 206, the further orthogonal mechanism 208, or a combination thereof corresponding to the first child information 214 and the second child information 216.

The node result 220 can be based on the first child information 214, the second child information 216, the combined child information 218, or a combination thereof.

As a more specific example, the node result 220 can include the combined child information 218 and the first child information 214. The node result 220 can be represented as '$(u_{1st}+u_{2nd}, u_{1st})$'.

Continuing with the above illustrative example, the content information portions 212 can include at least a first content portion 222, represented as '$u_0$', a second content portion 224, represented as '$u_1$', a third content portion 226, represented as '$u_2$', and a fourth content portion 228, represented as '$u_3$', therein. Each of the content portions can be unique set or grouping of data within the content 108.

Continuing with the example, the computing system 100 can use the first content portion 222 as the first child information 214 and the second content portion 224 as the second child information 216. The computing system 100 can implement the first orthogonal mechanism 204 to generate a first instance of the node result 220 combining and corresponding to the first content portion 222 and the second content portion 224. The first instance of the node result 220 can be represented as '$u_0^1$'.

Continuing with the example, the computing system 100 can further use the third content portion 226 as the first child information 214 and the fourth content portion 228 as the second child information 216. The computing system 100 can implement the first orthogonal mechanism 204 to generate a further result 230, as a different instance of the node result 220, combining and corresponding to the third content portion 226 and the fourth content portion 228. The further result 230 can be represented as '$u_2^3$'.

Continuing with the example, the computing system 100 can repeat the above process for the second orthogonal mechanism 206. The computing system 100 can use the first instance of the node result 220 as the first child information 214 and the further result 230 as the second child information 216. The computing system 100 can generate a subsequent result 232 based on implementing the second orthogonal mechanism 206 with the first instance of the node result 220 and the further result 230 as described above. The subsequent result 232 can be represented as '$u_0^3$'.

Continuing with the example, the computing system 100 can generate each unique instance of the node result 220 based on the channel polarization parameter 113 of FIG. 1, the Kronecker power 115 of FIG. 1, or a combination thereof according to a process level 234. The process level 234 can include a sequence, an order, a magnitude, or a combination thereof for representing each separate sub-mechanisms in the polar communication mechanism 112.

The process level 234 can represent each unique instance of the processing dimension 114. The process level 234 can further represent a level or a location within the tree architecture 202. As a specific example, the first orthogonal mechanism 204 applied initially and directly to the content 108 can correspond to the process level 234 of one. Also as a specific example, the second orthogonal mechanism 206 subsequent to the first orthogonal mechanism 204 can correspond to the process level 234 of two. The process level 234 can be less than or equal to the coding depth 210. The output from the process level 234 equal to the coding depth 210 can include the code word 120 of FIG. 1.

Continuing with the example, the computing system 100 can apply the channel polarization parameter 113 at each instance of the process level 234. As a more specific example, the first instance of the node result 220, the further result 230, or a combination thereof as exemplified above can include the channel polarization parameter 113.

Continuing with the example, the computing system 100 can include the channel polarization parameter 113 with the Kronecker power 115 corresponding to the process level 234. As a more specific example, the subsequent result 232 can include the channel polarization parameter 113 further applied in addition to inputs for the second orthogonal mechanism 206 already including the channel polarization parameter 113. The subsequent result 232 can include the channel polarization parameter 113 with the Kronecker power 115 of two, represented as '$G^{\otimes 2}$'. As a more specific example, processing output of the further orthogonal mechanism 208 subsequent to the second orthogonal mechanism 206 can include the channel polarization parameter 113 with the Kronecker power 115 of three, represented as '$G^{\otimes 3}$'.

Also as an illustrative example, the computing system 100 can implement the multi-dimensional decoding mechanism 118 by applying the first orthogonal mechanism 204, the second orthogonal mechanism 206, the further orthogonal mechanism 208, or a combination thereof to the receiver signal 126, a portion therein, a derivation thereof, or a combination thereof. The computing system 100 can implement the multi-dimensional decoding mechanism 118 using soft information 236, hard information 238, or a combination thereof.

The soft information 236 is a probability or a likelihood for various possibilities or values associated with uncertain information. The soft information 236 can represent the probability or the likelihood that received information for the receiver signal 126 or a portion therein is a certain bit, a certain symbol, a specific instance of the code word 120, or a combination thereof.

The soft information 236 can be a set of likelihood values or probabilities corresponding to a set of possible values for the receiver signal 126 or the portion therein. For example, the soft information 236 can include logarithmic likelihood ratio (LLR) values corresponding to the set of possible bits, symbols, code words, or a combination thereof for the receiver signal 126 or the portion therein.

The hard information 238 is a determined or a selected instance of the value identifying previously uncertain information. The hard information 238 can be a result of determination or selection of a specific instance of the bit, the symbol, the code word 120, or a combination thereof for the receiver signal 126 or the portion therein. For example, the hard information 238 can include a specific instance or a specific combination of bits, symbols, code words, or a combination thereof selected from the set of possible instances thereof.

The hard information 238 can be based on the soft information 236. The soft information 236 can be based on the hard information 238. Details regarding the multi-dimensional decoding mechanism 118 and the use of the soft information 236 and the hard information 238 will be described below.

Referring now to FIG. 3, therein is shown an exemplary representation for the multi-dimensional decoding mechanism 118. The exemplary representation can be for representing the multi-dimensional decoding mechanism 118 including the coding depth 210 of FIG. 2 having a value of 2, which can further represent coding dimension. The exemplary representation can further be for representing two instances of the orthogonal mechanisms of FIG. 2, such as the first orthogonal mechanism 204 of FIG. 2, the second orthogonal mechanism 206 of FIG. 2, the further orthogonal mechanism 208 of FIG. 2, or a combination thereof for the multi-dimensional decoding mechanism 118 including the coding depth 210 greater than 2.

The computing system 100 can implement the multi-dimensional decoding mechanism 118 to decode along a first dimension 302 for the receiver signal 126 of FIG. 1, a derivation thereof, a portion therein, or a combination thereof. The computing system 100 can calculate the soft information 236 of FIG. 2 as a result of the decoding process along the first dimension 302 without making any hard decisions.

For example, the computing system 100 can implement the multi-dimensional decoding mechanism 118 to decode across a row for the first dimension 302 represented as a horizontal arrangement of the receiver signal 126, a derivation thereof, a portion therein, or a combination thereof. For each of the rows, the computing system 100 can utilize the successive cancellation decoder 128 of FIG. 1 for a rate 1 polar code to calculate the soft information 236.

The computing system 100 can further implement the multi-dimensional decoding mechanism 118 to decode along a second dimension 304 for the receiver signal 126, a derivation thereof, a portion therein, or a combination thereof. The computing system 100 can calculate or determine the hard information 238 of FIG. 2 as a result of the decoding process along the second dimension 304 using hard decisions.

Continuing with the example, the computing system 100 can implement the multi-dimensional decoding mechanism 118 to decode across or down a column for the second dimension 304 represented as a vertical arrangement of the receiver signal 126, a derivation thereof, a portion therein, or a combination thereof. For each of the columns, the computing system 100 can utilize the successive cancellation decoder 128 by invoking the soft information 236 provided by the decoding process along the first dimension 302.

The computing system 100 can decode along the first dimension 302, the second dimension 304, or a combination thereof for the first orthogonal mechanism 204, the second orthogonal mechanism 206, the further orthogonal mechanism 208, or a combination thereof corresponding to the multi-dimensional decoding mechanism 118. For example, the computing system 100 can utilize the soft information 236 and the subsequently determined instance of the hard information 238 as an output for the first orthogonal mechanism 204.

Also for example, the computing system 100 can utilize the soft information 236 and the hard information 238 for the subsequent instance of the orthogonal processing mechanism. As a more specific example, the computing system 100 can utilize each instance of the process level 234 for decoding one bit.

The computing system 100 can implement the multi-dimensional decoding mechanism 118 to decode according to the coding depth 210 of FIG. 2. The computing system 100 can include the coding depth 210 identical for both the transmitter signal 122 of FIG. 1 and the receiver signal 126, both the multi-dimensional encoding mechanism 116 of FIG. 1 and the multi-dimensional decoding mechanism 118, or a combination thereof corresponding to transmitting and receiving the content 108 of FIG. 1. The computing system 100 can expand the above described decoding process across dimensions in addition to 2 dimensions exemplified by horizontal and vertical arrangement.

The computing system 100 can implement the various mechanisms described above in various ways. For example, the computing system 100 can implement the polar communication mechanism 112 of FIG. 1, the multi-dimensional encoding mechanism 116, the multi-dimensional encoding mechanism 116, the combined-iterative mechanism 130 of FIG. 1, the list decoding mechanism 132 of FIG. 1, the various orthogonal mechanisms, or a combination thereof using hardware, software, firmware, or a combination thereof. As a more specific example, the various mechanisms can be implemented using circuits, active or passive, gates, arrays, feedback loops, feed-forward loops, hardware connections, functions or function calls, instructions, equations, data manipulations, structures, addresses, or a combination thereof.

Figure 4:
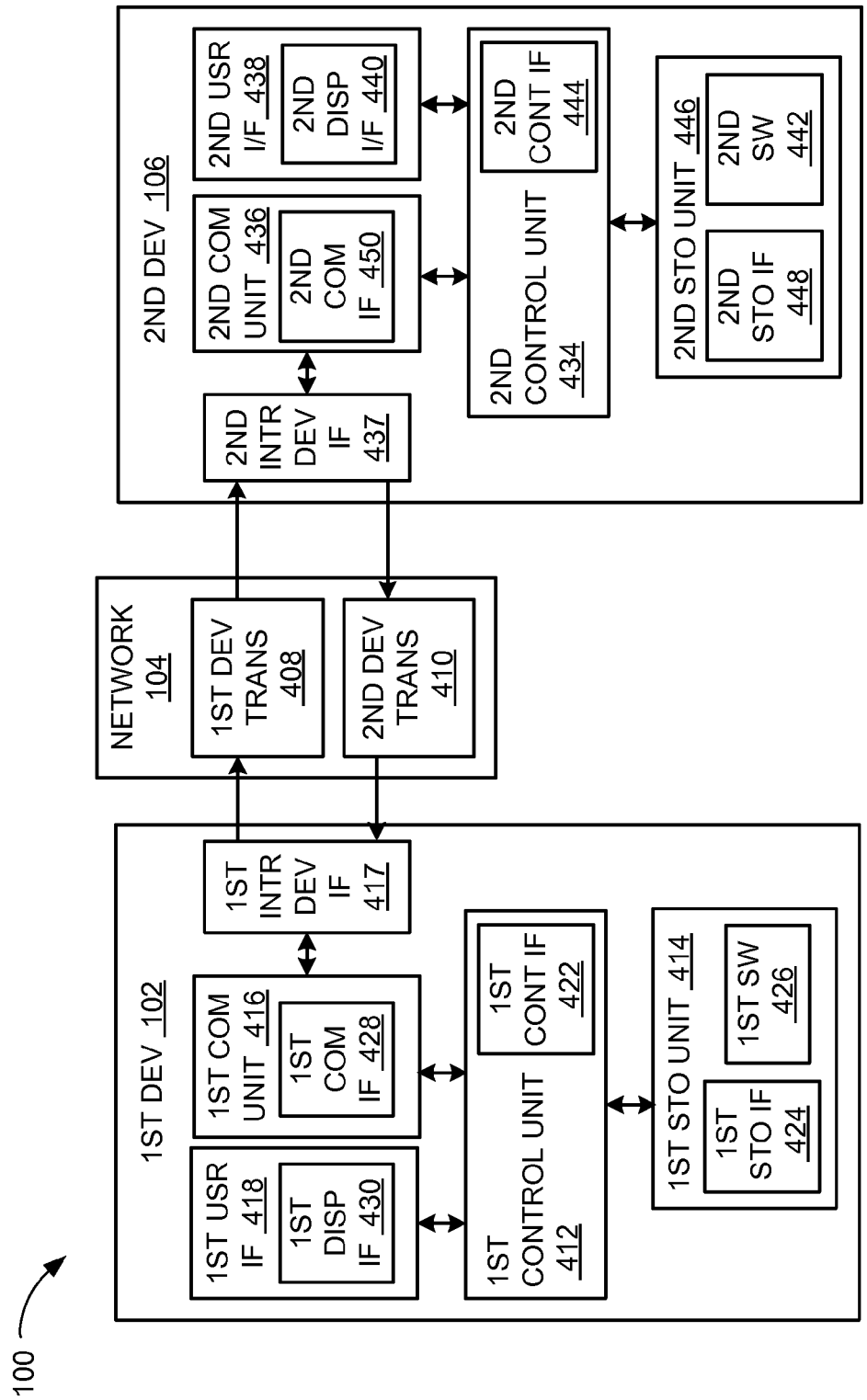
FIG. 4 is an exemplary block diagram of the computing system.

Referring now to FIG. 4, therein is shown an exemplary block diagram of the computing system 100. The computing system 100 can include the first device 102, the network 104, and the second device 106. The first device 102 can send information in a first device transmission 408 over the network 104 to the second device 106. The second device 106 can send information in a second device transmission 410 over the network 104 to the first device 102.

For illustrative purposes, the computing system 100 is shown with the first device 102 as a client device, although it is understood that the computing system 100 can have the first device 102 as a different type of device. For example, the first device 102 can be a server having a display interface.

Also for illustrative purposes, the computing system 100 is shown with the second device 106 as a server, although it is understood that the computing system 100 can have the second device 106 as a different type of device. For example, the second device 106 can be a client device.

For brevity of description in this embodiment of the present invention, the first device 102 will be described as a client device and the second device 106 will be described as a server device. The embodiment of the present invention is not limited to this selection for the type of devices. The selection is an example of an embodiment of the present invention.

The first device 102 can include a first control unit 412, a first storage unit 414, a first communication unit 416, and a first user interface 418. The first control unit 412 can include a first control interface 422. The first control unit 412 can execute a first software 426 to provide the intelligence of the computing system 100.

The first control unit 412 can be implemented in a number of different manners. For example, the first control unit 412 can be a processor, an application specific integrated circuit (ASIC) an embedded processor, a microprocessor, a hardware control logic, a hardware finite state machine (FSM), a digital signal processor (DSP), or a combination thereof. The first control interface 422 can be used for communication between the first control unit 412 and other functional units in the first device 102. The first control interface 422 can also be used for communication that is external to the first device 102.

The first control interface 422 can receive information from the other functional units or from external sources, or can transmit information to the other functional units or to external destinations. The external sources and the external destinations refer to sources and destinations external to the first device 102.

The first control interface 422 can be implemented in different ways and can include different implementations depending on which functional units or external units are being interfaced with the first control interface 422. For example, the first control interface 422 can be implemented with a pressure sensor, an inertial sensor, a microelectromechanical system (MEMS), optical circuitry, waveguides, wireless circuitry, wireline circuitry, or a combination thereof.

The first storage unit 414 can store the first software 426. The first storage unit 414 can also store the relevant information, such as data representing incoming images, data representing previously presented image, sound files, or a combination thereof.

The first storage unit 414 can be a volatile memory, a nonvolatile memory, an internal memory, an external memory, or a combination thereof. For example, the first storage unit 414 can be a nonvolatile storage such as non-volatile random access memory (NVRAM), Flash memory, disk storage, or a volatile storage such as static random access memory (SRAM).

The first storage unit 414 can include a first storage interface 424. The first storage interface 424 can be used for communication between the first storage unit 414 and other functional units in the first device 102. The first storage interface 424 can also be used for communication that is external to the first device 102.

The first storage interface 424 can receive information from the other functional units or from external sources, or can transmit information to the other functional units or to external destinations. The external sources and the external destinations refer to sources and destinations external to the first device 102.

The first storage interface 424 can include different implementations depending on which functional units or external units are being interfaced with the first storage unit 414. The first storage interface 424 can be implemented with technologies and techniques similar to the implementation of the first control interface 422.

The first communication unit 416 can enable external communication to and from the first device 102. For example, the first communication unit 416 can permit the first device 102 to communicate with the second device 106, a different device, an attachment, such as a peripheral device or a desktop computer, the network 104, or a combination thereof.

The first communication unit 416 can also function as a communication hub allowing the first device 102 to function as part of the network 104 and not limited to be an end point or terminal unit to the network 104. The first communication unit 416 can include active and passive components, such as microelectronics or an antenna, for interaction with the network 104.

The first communication unit 416 can include a baseband device or component, a modem, a digital signal processor, or a combination thereof for transmitting, formatting, receiving, detecting, decoding, further processing, or a combination thereof for communication signals. The first communication unit 416 can include one or more portions for processing the voltages, the currents, the digital information, or a combination thereof, such as an analog-to-digital converter, a digital-to-analog converter, a filter, an amplifier, a processor-type circuitry, or a combination thereof. The first communication unit 416 can further include one or more portions for storing information, such as cache or RAM memory, registers, or a combination thereof.

The first communication unit 416 can be coupled with a first inter-device interface 417. The first inter-device interface 417 can be a device or a portion of a device for physically communicating signals with a separate device. The first inter-device interface 417 can communicate by transmitting or receiving signals to or from another device. The first inter-device interface 417 can include one or more antennas for wireless signals, a physical connection and receiver-transmitter for wired signals, or a combination thereof. The first inter-device interface 417 can include an omnidirectional antenna, a wire, an antenna chip, a ceramic antenna, or a combination thereof. The first inter-device interface 417 can further include a port, a wire, a repeater, a connector, a filter, a sensor, or a combination thereof.

The first inter-device interface 417 can detect or respond to a power in electromagnetic waves and provide the detected result to the first communication unit 416 to receive a signal, including the second device transmission 410. The first inter-device interface 417 can provide a path or respond to currents or voltages provided by the first communication unit 416 to transmit a signal, including the first device transmission 408.

The first communication unit 416 can include a first communication interface 428. The first communication interface 428 can be used for communication between the first communication unit 416 and other functional units in the first device 102. The first communication interface 428 can receive information from the other functional units or can transmit information to the other functional units.

The first communication interface 428 can include different implementations depending on which functional units are being interfaced with the first communication unit 416. The first communication interface 428 can be implemented with technologies and techniques similar to the implementation of the first control interface 422.

The first user interface 418 allows a user (not shown) to interface and interact with the first device 102. The first user interface 418 can include an input device and an output device. Examples of the input device of the first user interface 418 can include a keypad, a touchpad, soft-keys, a keyboard, a microphone, an infrared sensor for receiving remote signals, or any combination thereof to provide data and communication inputs.

The first user interface 418 can include a first display interface 430. The first display interface 430 can include an output device. The first display interface 430 can include a display, a projector, a video screen, a speaker, or any combination thereof.

The first control unit 412 can operate the first user interface 418 to display information generated by the computing system 100. The first control unit 412 can also execute the first software 426 for the other functions of the computing system 100. The first control unit 412 can further execute the first software 426 for interaction with the network 104 via the first communication unit 416.

The second device 106 can be optimized for implementing an embodiment of the present invention in a multiple device embodiment with the first device 102. The second device 106 can provide the additional or higher performance processing power compared to the first device 102. The second device 106 can include a second control unit 434, a second communication unit 436, a second user interface 438, and a second storage unit 446.

The second user interface 438 allows a user (not shown) to interface and interact with the second device 106. The second user interface 438 can include an input device and an output device. Examples of the input device of the second user interface 438 can include a keypad, a touchpad, soft-keys, a keyboard, a microphone, or any combination thereof to provide data and communication inputs. Examples of the output device of the second user interface 438 can include a second display interface 440. The second display interface 440 can include a display, a projector, a video screen, a speaker, or any combination thereof.

The second control unit 434 can execute a second software 442 to provide the intelligence of the second device 106 of the computing system 100. The second software 442 can operate in conjunction with the first software 426. The second control unit 434 can provide additional performance compared to the first control unit 412.

The second control unit 434 can operate the second user interface 438 to display information. The second control unit 434 can also execute the second software 442 for the other functions of the computing system 100, including operating the second communication unit 436 to communicate with the first device 102 over the network 104.

The second control unit 434 can be implemented in a number of different manners. For example, the second control unit 434 can be a processor, an embedded processor, a microprocessor, hardware control logic, a hardware finite state machine (FSM), a digital signal processor (DSP), or a combination thereof.

The second control unit 434 can include a second control interface 444. The second control interface 444 can be used for communication between the second control unit 434 and other functional units in the second device 106. The second control interface 444 can also be used for communication that is external to the second device 106.

The second control interface 444 can receive information from the other functional units or from external sources, or can transmit information to the other functional units or to external destinations. The external sources and the external destinations refer to sources and destinations external to the second device 106.

The second control interface 444 can be implemented in different ways and can include different implementations depending on which functional units or external units are being interfaced with the second control interface 444. For example, the second control interface 444 can be implemented with a pressure sensor, an inertial sensor, a microelectromechanical system (MEMS), optical circuitry, waveguides, wireless circuitry, wireline circuitry, or a combination thereof.

A second storage unit 446 can store the second software 442. The second storage unit 446 can also store the information such as data representing incoming images, data representing previously presented image, sound files, or a combination thereof. The second storage unit 446 can be sized to provide the additional storage capacity to supplement the first storage unit 414.

For illustrative purposes, the second storage unit 446 is shown as a single element, although it is understood that the second storage unit 446 can be a distribution of storage elements. Also for illustrative purposes, the computing system 100 is shown with the second storage unit 446 as a single hierarchy storage system, although it is understood that the computing system 100 can have the second storage unit 446 in a different configuration. For example, the second storage unit 446 can be formed with different storage technologies forming a memory hierarchal system including different levels of caching, main memory, rotating media, or off-line storage.

The second storage unit 446 can be a volatile memory, a nonvolatile memory, an internal memory, an external memory, or a combination thereof. For example, the second storage unit 446 can be a nonvolatile storage such as non-volatile random access memory (NVRAM), Flash memory, disk storage, or a volatile storage such as static random access memory (SRAM).

The second storage unit 446 can include a second storage interface 448. The second storage interface 448 can be used for communication between the second storage unit 446 and other functional units in the second device 106. The second storage interface 448 can also be used for communication that is external to the second device 106.

The second storage interface 448 can receive information from the other functional units or from external sources, or can transmit information to the other functional units or to external destinations. The external sources and the external destinations refer to sources and destinations external to the second device 106.

The second storage interface 448 can include different implementations depending on which functional units or external units are being interfaced with the second storage unit 446. The second storage interface 448 can be implemented with technologies and techniques similar to the implementation of the second control interface 444.

The second communication unit 436 can enable external communication to and from the second device 106. For example, the second communication unit 436 can permit the second device 106 to communicate with the first device 102 over the network 104.

The second communication unit 436 can also function as a communication hub allowing the second device 106 to function as part of the network 104 and not limited to be an end point or terminal unit to the network 104. The second communication unit 436 can include active and passive components, such as microelectronics or resistors, for interaction with the network 104.

The second communication unit 436 can include a baseband device or component, a modem, a digital signal processor, or a combination thereof for transmitting, formatting, receiving, detecting, decoding, further processing, or a combination thereof for communication signals. The second communication unit 436 can include one or more portions for processing the voltages, the currents, the digital information, or a combination thereof, such as an analog-to-digital converter, a digital-to-analog converter, a filter, an amplifier, a processor-type circuitry, or a combination thereof. The second communication unit 436 can further include one or more portions for storing information, such as cache or RAM memory, registers, or a combination thereof.

The second communication unit 436 can be coupled with a second inter-device interface 437. The second inter-device interface 437 can be a device or a portion of a device for physically communicating signals with a separate device. The second inter-device interface 437 can communicate by transmitting or receiving signals to or from another device. The second inter-device interface 437 can include one or more antennas for wireless signals, a physical connection and receiver-transmitter for wired signals, or a combination thereof. The second inter-device interface 437 can include an omnidirectional antenna, a wire, an antenna chip, a ceramic antenna, or a combination thereof. The second inter-device interface 437 can further include a port, a wire, a repeater, a connector, a filter, a sensor, or a combination thereof.

The second inter-device interface 437 can detect or respond to a power in electromagnetic waves and provide the detected result to the second communication unit 436 to receive a signal, including the first device transmission 408. The second inter-device interface 437 can provide a path or respond to currents or voltages provided by the second communication unit 436 to transmit a signal, including the second device transmission 410.

The second communication unit 436 can include a second communication interface 450. The second communication interface 450 can be used for communication between the second communication unit 436 and other functional units in the second device 106. The second communication interface 450 can receive information from the other functional units or can transmit information to the other functional units.

The second communication interface 450 can include different implementations depending on which functional units are being interfaced with the second communication unit 436. The second communication interface 450 can be implemented with technologies and techniques similar to the implementation of the second control interface 444.

The first communication unit 416 can couple with the network 104 to send information to the second device 106 in the first device transmission 408. The second device 106 can receive information in the second communication unit 436 from the first device transmission 408 of the network 104.

The second communication unit 436 can couple with the network 104 to send information to the first device 102 in the second device transmission 410. The first device 102 can receive information in the first communication unit 416 from the second device transmission 410 of the network 104. The computing system 100 can be executed by the first control unit 412, the second control unit 434, or a combination thereof. For illustrative purposes, the second device 106 is shown with the partition having the second user interface 438, the second storage unit 446, the second control unit 434, and the second communication unit 436, although it is understood that the second device 106 can have a different partition. For example, the second software 442 can be partitioned differently such that some or all of its function can be in the second control unit 434 and the second communication unit 436. Also, the second device 106 can include other functional units not shown in FIG. 4 for clarity.

The functional units in the first device 102 can work individually and independently of the other functional units. The first device 102 can work individually and independently from the second device 106 and the network 104.

The functional units in the second device 106 can work individually and independently of the other functional units. The second device 106 can work individually and independently from the first device 102 and the network 104.

The functional units described above can be implemented in hardware. For example, one or more of the functional units can be implemented using the a gate, circuitry, a processor, a computer, integrated circuit, integrated circuit cores, a pressure sensor, an inertial sensor, a microelectromechanical system (MEMS), a passive device, a physical non-transitory memory medium having instructions for performing the software function, a portion therein, or a combination thereof.

For illustrative purposes, the computing system 100 is described by operation of the first device 102 and the second device 106. It is understood that the first device 102 and the second device 106 can operate any of the modules and functions of the computing system 100.

Figure 5:
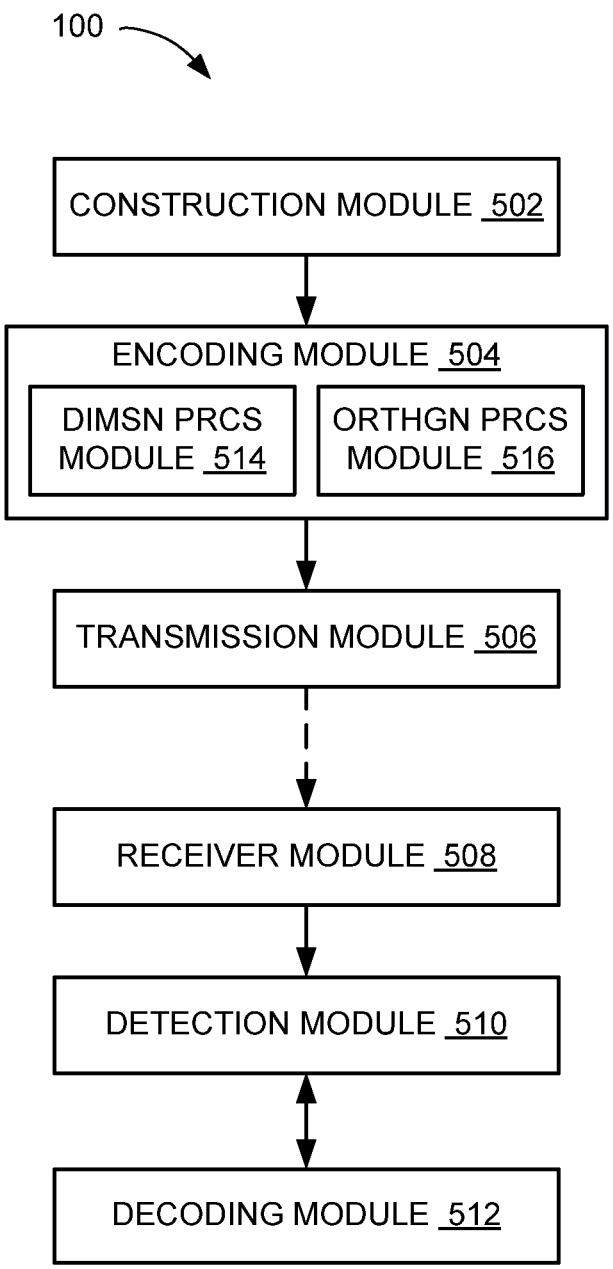
FIG. 5 is a control flow of the computing system.

Referring now to FIG. 5, therein is shown a control flow of the computing system 100. The computing system 100 can include a construction module 502, an encoding module 504, a transmission module 506, a receiver module 508, a detection module 510, a decoding module 512, or a combination thereof.

The construction module 502 can be coupled with the encoding module 504, which can be coupled to the transmission module 506. The transmission module 506 can be further coupled with the receiver module 508, which can be further coupled with the detection module 510. The detection module 510 can be further coupled with the decoding module 512.

The modules can be coupled to each other in a variety of ways. For example, modules can be coupled by having the input of one module connected to the output of another, such as by using wired or wireless connections, the network 104 of FIG. 1, instructional steps, process sequence, or a combination thereof. Also for example, the modules can be coupled either directly with no intervening structure other than connection means between the directly coupled modules, or indirectly with modules or devices other than the connection means between the indirectly coupled modules.

As a more specific example, one or more inputs or outputs of the construction module 502 can be directly connected to one or more inputs or outputs of the encoding module 504 using conductors or using the transmission channel 124 of FIG. 1 without intervening modules or devices there-between. Also as a more specific example, the transmission module 506 can be coupled with the receiver module 508 indirectly using a repeater, a switch, a routing device, a separate process, the network 104, or a combination thereof there-between. The construction module 502, the encoding module 504, the transmission module 506, the receiver module 508, the detection module 510, the decoding module 512, or a combination thereof can be coupled directly or indirectly in similar ways.

The computing system 100 can communicate with or using a device, such as by displaying images, recreating sounds, exchanging process steps or instructions, or a combination thereof. The computing system 100 can communicate information between devices. The receiving device can further communicate with the user by displaying images, recreating sounds, exchanging process steps or instructions, or a combination thereof according to the information communicate to the device.

The construction module 502 is configured to prepare information for communication. The construction module 502 can determine information for communicating between devices. The construction module 502 can determine information for the content 108 of FIG. 1.

The construction module 502 can determine information for the content 108 in a variety of ways. For example, the construction module 502 can receive the content 108 from a user or a device through the first user interface 418 of FIG. 4, the second user interface 438 of FIG. 4, the first inter-device unit 416 of FIG. 4, the second inter-device unit 436 of FIG. 4, or a combination thereof.

Also for example, the construction module 502 can access the content 108 stored in the first storage unit 414 of FIG. 4, the second storage unit 446 of FIG. 4, the first communication unit 416 of FIG. 4, the second communication unit 436 of FIG. 4, or a combination thereof. Also for example, the construction module 502 can determine the content 108 using the first control unit 412 of FIG. 4, the second control unit 434 of FIG. 4, the first communication unit 416, the second communication unit 436, or a combination thereof.

The construction module 502 can further determine the content 108 by formatting or arranging the information. For example, the construction module 502 can multiplex or de-multiplex the information to determine the content 108 for communicating to another device, such as from the first device 102 of FIG. 1 to the second device 106 of FIG. 1, from the second device 106 to the first device 102, or a combination thereof.

Also for example, the construction module 502 can insert or add information, such as certain zero values for specific locations, error detection data, header data, format data, or a combination thereof. Also for example, the construction module 502 can arrange or sequence the data, such as for interleaving, de-interleaving, forming arrays or lists, or a combination thereof.

As a more specific example, the construction module 502 can arrange the information for the content 108 as a matrix of n-dimensions. The number of dimensions can be associated with the processing length 110 of FIG. 1. The content 108 can include, such as based on receiving by formatting, the processing length 110, represented as 'N=$2^n$'. The exponential power 'n' can represent the number of dimensions. The construction module 502 can format or arrange the information for the content 108 according to a process or a method predetermined by the computing system 100, such as based on a standard, a coding algorithm, a number of transmit or receive antennas, the coding depth 210 of FIG. 2, capability of a device, or a combination thereof.

The construction module 502 can further use the first communication unit 416, the second communication unit 436, the first control unit 412, the second control unit 434, or a combination thereof to determine the content 108. The construction module 502 can store the content 108 in the first communication unit 416, the second communication unit 436, the first storage unit 414, the second storage unit 446, or a combination thereof.

After preparing information for communication, the control flow can pass to the encoding module 504. The control flow can pass through a variety of ways. For example, control flow can pass by having processing results of one module passed to another module, such as by passing the content 108 from the construction module 502 to the encoding module 504, by storing the processing results at a location known and accessible to the other module, such as by storing the content 108 at a storage location known and accessible to the encoding module 504, by notifying the encoding module 504, such as by using a flag, an interrupt, a status signal, or a combination thereof, or a combination of processes thereof.

The encoding module 504 is configured to process the content 108 based on the polar communication mechanism 112 of FIG. 1 utilizing multiple instances of the processing dimension 114 of FIG. 1 for communicating the content 108, including sending or transmitting the content 108. The encoding module 504 can implement the multi-dimensional encoding mechanism 116 of FIG. 1 to generate the code word 120 of FIG. 1 for processing the content 108. The encoding module 504 can generate the code word 120 as a result from implementing the multi-dimensional encoding mechanism 116 for representing the content 108.

The encoding module 504 can encode the content 108 using the multi-dimensional encoding mechanism 116 to generate the code word 120 corresponding to or representing the content 108. The encoding module 504 can encode the content 108 along multiple instances of the processing dimension 114 according to the tree architecture 202 of FIG. 2 included in the multi-dimensional encoding mechanism 116.

The encoding module 504 can be for implementing the n-dimensional polar transformation. The n-dimensional polar transformation can be associated with the processing length 110, the coding depth 210, or a combination thereof. The encoding module 504 can implement the first orthogonal mechanism 204 of FIG. 2, the second orthogonal mechanism 206 of FIG. 2, one or more instances of the further orthogonal mechanism 208 of FIG. 2, or a combination thereof.

The encoding module 504 can further encode for multiple instances of the process level 234 of FIG. 2 corresponding to the coding depth 210. The encoding module 504 can apply the channel polarization parameter 113 of FIG. 1 at each instance of the process level 234. The encoding module 504 can include a dimensional processing module 514, an orthogonal processing module 516, or a combination thereof for implementing the multi-dimensional encoding mechanism 116 and generating the code word 120.

The dimensional processing module 514 is configured to encode the content 108 along one instance of the processing dimension 114. For example, the dimensional processing module 514 can implement the first orthogonal mechanism 204 corresponding to the first dimension 302 of FIG. 3 for the multi-dimensional encoding mechanism 116.

The dimensional processing module 514 can initialize the tree architecture 202 by assigning the content information portions 212 of FIG. 2 of the content 108 as the leaves for the tree architecture 202 for the multi-dimensional encoding mechanism 116 according to the first orthogonal mechanism 204. For example, the dimensional processing module 514 can load each instance of the content information portions 212 into registers or memory serving as the leaves of the tree architecture 202. Also for example, the dimensional processing module 514 can load according to a sequence dictated by the content 108, such as from left to right or beginning to end.

As a more specific example, the dimensional processing module 514 can load the first content portion 222 of FIG. 2, the second content portion 224 of FIG. 2, the third content portion 226 of FIG. 2, and the fourth content portion 228 of FIG. 2, representing '$u_0$' to '$u_3$', each into a register or memory representing a leaf for the tree architecture 202. The dimensional processing module 514 can load the content 108 into leaves according to the processing length 110, such as for the content information portions 212 ranging from 0 to 'N−1', represented as '$u_0^{N-1}$'.

The dimensional processing module 514 can generate the node result 220 of FIG. 2 based on applying the first orthogonal mechanism 204. The dimensional processing module 514 can generate the node result 220 based on the first child information 214 of FIG. 2, the second child information 216 of FIG. 2, the combined child information 218 of FIG. 2, or a combination thereof.

The dimensional processing module 514 can generate the node result 220 based on identifying the left-most instance, first instance, odd instance, or a combination thereof for the available input information as the first child information 214. The dimensional processing module 514 can identify the next available information in sequence or order as the second child information 216.

The dimensional processing module 514 can calculate the combined child information 218 based on combining the first child information 214 and the second child information 216. The dimensional processing module 514 can generate the node result 220 based on the combined child information 218, the first child information 214, the second child information 216, or a combination thereof. The dimensional processing module 514 can calculate the node result 220 based on computing '$(u_{1st}+u_{2nd}, u_{1st})$'. The dimensional processing module 514 can calculate multiple instances of the node result 220 corresponding to all groupings or subsets of the content information portions 212 within the content 108.

Continuing with the specific example, the dimensional processing module 514 can generate the first instance of the node result 220 based on applying the first orthogonal mechanism 204 to the content 108 including the first content portion 222, the second content portion 224, the third content portion 226, and the fourth content portion 228. The dimensional processing module 514 can identify the first content portion 222 as the first child information 214, the second content portion 224 as the second child information 216, or a combination thereof.

Continuing with the example, the dimensional processing module 514 can calculate the combined child information 218 based on the first child information 214 and the second child information 216 as described above. The dimensional processing module 514 can further generate the first instance of the node result 220 based on the first content portion 222, the second content portion 224, the combined child information 218, or a combination thereof as described above. The dimensional processing module 514 can generate the first instance of the node result 220 based on combining the first content portion 222 corresponding to the first child information 214 and the second content portion 224 corresponding to the second child information 216 according to the first orthogonal mechanism 204.

Continuing with the example, the dimensional processing module 514 can repeat the above described process for the third content portion 226, the fourth content portion 228, or a combination thereof to generate the further result 230 of FIG. 2 as a different instance of the node result 220. The dimensional processing module 514 can identify the third content portion 226 as the first child information 214, the fourth content portion 228 as the second child information 216, or a combination thereof.

Continuing with the example, the dimensional processing module 514 can calculate the combined child information 218 based on the third content portion 226 and the fourth content portion 228 as described above. The dimensional processing module 514 can further generate the further result 230 based on the third content portion 226, the fourth content portion 228, the combined child information 218, or a combination thereof as described above. The dimensional processing module 514 can further generate the further result 230 based on combining the third content portion 226 corresponding to the first child information 214 and the fourth content portion 228 corresponding to the second child information 216 according to the first orthogonal mechanism 204.

The dimensional processing module 514 can repeat the exemplified processes based on the processing length 110. The dimensional processing module 514 can generate instances of the node result 220 corresponding to unique groupings of the content information portions 212. The dimensional processing module 514 can repeat the exemplified processes for entirety of the content 108.

The orthogonal processing module 516 is configured to encode the content 108 along a different instance of the processing dimension 114 than the dimensional processing module 514. The orthogonal processing module 516 can encode results of the dimensional processing module 514. For example, the orthogonal processing module 516 can implement the second orthogonal mechanism 206 corresponding to the second dimension 304 of FIG. 3 orthogonal to the first orthogonal mechanism 204.

The orthogonal processing module 516 can implement the second orthogonal mechanism 206 similar to the dimensional processing module 514 implementing the first orthogonal mechanism 204. The orthogonal processing module 516 can process multiple instances of the node result 220 from the first orthogonal mechanism 204 using the second orthogonal mechanism 206. The orthogonal processing module 516 can process multiple instances of the node result 220 from a prior instance of the process level 234 and generate the node result 220 for a subsequent instance of the process level 234, such as the subsequent result 232 of FIG. 2.

Continuing with the more specific example above, the orthogonal processing module 516 can load the first instance of the node result 220 as the first child information 214, the further result 230 as the second child information 216, or a combination thereof. The orthogonal processing module 516 can calculate the combined child information 218 based on combining instances of the node result 220, such as the first instance of the node result 220 and the further result 230.

Continuing with the example, the orthogonal processing module 516 can further generate the subsequent result 232 based on the first instance of the node result 220, the further result 230, the combined child information 218, or a combination thereof. The orthogonal processing module 516 can generate the subsequent result 232 based instances of the node result 220 from the first orthogonal mechanism 204 according to the second orthogonal mechanism 206, such as based on combining the node result 220 and the further result 230 from the first orthogonal mechanism 204 according to the second orthogonal mechanism 206.

The orthogonal processing module 516 can repeat the exemplified processes based on a length or amount of results resulting from the previous instance of the process level 234. The orthogonal processing module 516 can generate one or more instances of the node result 220 corresponding to a subsequent instance of the process level 234. The orthogonal processing module 516 can repeat the exemplified processes for entirety of available input information.

The encoding module 504 can generate the code word 120 for processing the content 108 as the node result 220 corresponding to last instance of the process level 234 according to the coding depth 210. The multi-dimensional encoding mechanism 116 can recursively or iteratively process the content 108 as described above until the last instance of the process level 234 generates one instance of the node result 220, which can be used as the code word 120.

The encoding module 504 can generate the code word 120 based on using a pair or a set of vectors, such as the first child information 214 and the second child information 216, from its child connections at each process level 234. The encoding module 504 can generate the corresponding instance of the node result 220 as described above and returns it to its parent in the next time instance.

For example, the encoding module 504 can include the dimensional processing module 514 and the orthogonal processing module 516 for the coding depth 210 of 2. The encoding module 504 can set the subsequent result 232 from the orthogonal processing module 516 as the code word 120.

Also for example, the encoding module 504 can include additional sub-modules beyond the dimensional processing module 514 and the orthogonal processing module 516 each implementing the further orthogonal mechanism 208 and each corresponding to a unique instance of the process level 234 above 2 and corresponding to the coding depth 210. The encoding module 504 can set the node result 220 from the last instance of the sub-modules as the code word 120.

Also for example, the encoding module 504 can utilize the dimensional processing module 514 and the orthogonal processing module 516 iteratively to generate the code word 120. The encoding module 504 can iteratively process the node result 220 according to the coding depth 210. The encoding module 504 can generate the node result 220 from the last instance of the process level 234 according to the coding depth 210 as the code word 120.

As a more specific example, the dimensional processing module 514 can be used to implement the further orthogonal mechanism 208 using the instances of the subsequent result 232 from the orthogonal processing module 516 implementing the second orthogonal mechanism 206. As a further specific example, the orthogonal processing module 516 can further be used to implement a further instance of the further orthogonal mechanism 208 for output results of the dimensional processing module 514 implementing the further orthogonal mechanism 208 corresponding to a prior instance of the process level 234.

Continuing with the specific example, above, the encoding module 504 can generate the code word 120 corresponding to the content 108 including the first content portion 222, the second content portion 224, the third content portion 226, and the fourth content portion 228. The encoding module 504 can generate the code word 120 can generate the code word 120 based on the second orthogonal mechanism 206 applied to the instances of the node result 220 from the first orthogonal mechanism 204. The encoding module 504 can generate the code word 120 from the node result 220 based on using the first child information 214 and the second child information 216 according to the first orthogonal mechanism 204, the second orthogonal mechanism 206, or a combination thereof as described above.

The encoding module 504 can generate the code word 120 from the node result 220 generated based on the channel polarization parameter 113 and the Kronecker power 115 corresponding to the process level 234 associated with the first orthogonal mechanism 204, the second orthogonal mechanism 206, the further orthogonal mechanism 208, or a combination thereof. The encoding module 504 can apply the channel polarization parameter 113 at each instance of the process level 234. The encoding module 504 can apply the channel polarization parameter 113 and the Kronecker power 115 corresponding to the process level 234 or the coding depth 210 to generate the code word 120.

It has been discovered that the polar communication mechanism 112 utilizing multiple instances of the processing dimension 114 provides reduced processing complexity for rate-adaptive communication achieving capacity. The encoding over multiple dimensions can provide the rate-adaptive nature for the channel polarization to further provide communication achieving capacity while maintaining low-complexity.

It has further been discovered that the code word 120 generated based on processing the node result 220 from the first orthogonal mechanism 204 with the second orthogonal mechanism 206 provides reduced processing latency for the overall communication. The code word 120 based on the first orthogonal mechanism 204 and the second orthogonal mechanism 206 can enable reduced decoding latency required to decode the code word 120.

It has further been discovered that the code word 120 generated using the multi-dimensional encoding mechanism 116 based on applying the first orthogonal mechanism 204 to the content 108 and applying the second orthogonal mechanism 206 to resulting instance of the node result 220 provides reduced memory requirements for the overall communication. The code word 120 based on the first orthogonal mechanism 204 with the second orthogonal mechanism 206 can enable reduction memory required to decode the code word 120.

It has further been discovered that the code word 120 corresponding to the channel polarization parameter 113 and the Kronecker power 115 associated with each instance of the process level 234 provides reduced processing complexity for rate-adaptive communication achieving capacity. The encoding over multiple dimensions with the channel polarization parameter 113 and the Kronecker power 115 with each instance of the processing dimension 114 corresponding to each instance of the process level 234 can provide the rate-adaptive nature for the channel polarization to further provide communication achieving capacity while maintaining low-complexity.

After generating the code word 120, the control flow can be passed from the encoding module 504 to the transmission module 506. The control flow can pass similarly as described above between the construction module 502 and the encoding module 504, but using processing results of the encoding module 504, such as the code word 120 or the node result 220.

The transmission module 506 and the receiver module 508 are configured to communicate the content 108 between devices. The transmission module 506 and the receiver module 508 can communicate the content 108 between the first device 102 and the second device 106. The transmission module 506 and the receiver module 508 can communicate by transmitting and receiving signals for communicating the content 108.

The transmission module 506 can transmit the transmitter signal 122 of FIG. 1 for including or corresponding to the code word 120 for communicating the content 108. The transmission module 506 can use the first inter-device interface 417, the second inter-device interface 437, the first communication device 416, the second communication unit 436, or a combination thereof to transmit the transmitter signal 122.

The transmission module 506 can transmit the transmitter signal 122 using the transmission channel 124. For example, the transmission module 506 can transmit the transmitter signal 122 through a number of independent copies of the B-DMC for the transmission channel 124. The transmission module 506 can transmit the transmitter signal 122 through the number of independent copies of the B-DMC corresponding to or associated with the processing length 110.

The receiver module 508 can receive the receiver signal 126 of FIG. 1 corresponding to the transmitter signal 122. The receiver module 508 can receive the receiver signal 126 corresponding to the transmitter signal 122 after traversing the transmission channel 124, the network 104, or a combination thereof. The receiver module 508 can receive the receiver signal 126 using the second inter-device interface 437, the first inter-device interface 417, the first communication device 416, the second communication unit 436, or a combination thereof.

The transmission module 506 can store the transmitter signal 122 in the first communication device 416, the second communication unit 436, the first storage unit 414, the second storage unit 446, or a combination thereof. The receiver module 508 can store the receiver signal 126 in the first communication device 416, the second communication unit 436, the first storage unit 414, the second storage unit 446, or a combination thereof.

After communicating and exchanging the content 108 or a derivation thereof between devices, the control flow can be passed from the receiver module 508 to the detection module 510. The control flow can pass similarly as described above between the construction module 502 and the encoding module 504, but using processing results of the receiver module 508, such as the receiver signal 126.

The detection module 510 is configured to recognize information regarding or for the receiver signal 126. The detection module 510 can determine symbol level information, the code word 120, bit level information, or a combination thereof in the receiver signal 126. The detection module 510 can determine information in the receiver signal 126 corresponding to the transmitter signal 122, or a combination thereof.

For example, the detection module 510 can determine the symbols originally included in the transmitter signal 122. The detection module 510 can identify the transmitted symbols by identifying and compensating for degradations or changes in the transmitted symbols due to properties of the transmission channel 124. The detection module 510 can identify and compensate for the degradations or changes using reference communications, such as pilot tone or reference signal, transmitted by the base station. The detection module 510 can include a predetermined frequency, phase, content, shape, power level, or a combination thereof set by the communication standard, the computing system 100, or a combination thereof.

Also for example the detection module 510 can identify the effects of the transmission channel 124, determine the transmitted symbols, or a combination thereof using mathematical models including shifting, using mathematical operations, or a combination thereof. The detection module 510 can further use frequency or time domain transformation, convolution, transposition, or a combination thereof with the predetermined or received instances of the reference communication, or with both.

Continuing with the example, the detection module 510 can use methods such as the least square method, the least mean square (LMS) method, or the minimum mean square error (MMSE) method to determine the transmitted symbols corresponding to the code word 120, the content 108, or a combination thereof. The detection module 510 can transform the received and processed symbol information into symbols, bit information, or a combination thereof.

The detection module 510 can include the resulting symbol-level information with the receiver signal 126. The detection module 510 can generate a sequence of symbols based on hard decisions or a set of likelihood values, such as LLR values, for originally transmitted symbols. The detection module 510 can update the receiver signal 126 as the symbols from hard decisions or set of likelihood values corresponding to the transmitted symbols in the transmitter signal 122.

After recognize information regarding or for the receiver signal 126, the control flow can be passed from the detection module 510 to the decoding module 512. The control flow can pass similarly as described above between the construction module 502 and the encoding module 504, but using processing results of the detection module 510, such as the receiver signal 126 including symbol-level information.

The decoding module 512 is configured to process for the content 108 based on the polar communication mechanism 112 utilizing multiple instances of the processing dimension 114 for communicating the content 108, including for receiving and recovering the content 108. The decoding module 512 can implement the multi-dimensional decoding mechanism 118 of FIG. 1 to decode the receiver signal 126 and recover the code word 120, the content 108, or a combination thereof. The decoding module 512 can recover the content as a result from implementing the multi-dimensional decoding mechanism 118.

The decoding module 512 can decode the receiver signal 126 along multiple instances of the processing dimension 114 according to the tree architecture 202 included in the multi-dimensional decoding mechanism 118. The decoding module 512 can implement the first orthogonal mechanism 204 corresponding to the first dimension 302, the second orthogonal mechanism 206 corresponding to the second dimension 304, the further orthogonal mechanism 208 corresponding to an additional dimension, or a combination thereof.

The first dimension 302, the second dimension 304, the additional dimension, or a combination thereof can be orthogonal each other. The first orthogonal mechanism 204, the second orthogonal mechanism 206, the further orthogonal mechanism 208, or a combination thereof can further include processes or data orthogonal to each other.

The decoding module 512 can be parallel to the encoding module 504. The decoding module 512 can decode information corresponding to the n-dimensional polar transformation. The decoding module 512 can recover or reverse the processing from the encoding module 504. The decoding module 512 can implement the error-correcting process, the error-detection process, or a combination thereof to recover the content 108 originally intended for communication.

For example, the decoding module 512 can further decode for multiple instances of the process level 234 corresponding to the coding depth 210 identical to the encoding module 504. The decoding module 512 can implement the first orthogonal mechanism 204, the second orthogonal mechanism 206, the further orthogonal mechanism 208, or a combination thereof corresponding to the first dimension 302, the second dimension 304, the additional dimension, or a combination thereof for the multi-dimensional decoding mechanism 118.

The decoding module 512 can decode the content 108 based on decoding children nodes for an internal node. As a specific example, the decoding module 512 can start with a root or a first instance of the internal node using the receiver signal 126 from the detection module 510 or a portion of the receiver signal 126, such as corresponding to on or a set number of instances for the code word 120 or a symbol.

Continuing with the example, the decoding module 512 can implement the decoding process for two children nodes corresponding to the subsequent instance of the process level 234. The decoding module 512 can decode based on calculating the soft information 236 of FIG. 2, the hard information 238 of FIG. 2, or a combination thereof corresponding to the process level 234 for the receiver signal 126 or a portion therein.

The decoding module 512 can calculate the soft information 236 based on:

$$\frac{W_N^{(i)}(y_1^N, u_1^{i-1} | u_i = 0)}{W_N^{(i)}(y_1^N, u_1^{i-1} | u_i = 1)}. \qquad \text{Equation (4)}.$$

The term '$W_N^{(i)}$' can represent the i-th bit channel of the transmission channel 124. The receiver signal 126 or a portion therein can be represented by '$y_1^N$'. The transmitter signal 122 or a portion therein can be represented by $u_1^{i-1}$. The term '$u_i$' can represent a given or a targeted bit for the decoding process. The soft information 236 can be calculated as an LLR value or a likelihood ratio (LR) value. The soft information 236 can be represented as 'L'.

The soft information 236 of the root of the tree architecture 202 for the multi-dimensional decoding mechanism 118 can be vector of length N, corresponding to the processing length 110, provided by the N number of channel observations. The soft information 236 for the internal node can be represented as 'L=(L$_1$, L$_2$)', where the length of 'L$_1$,' and 'L$_2$,' are half of the length of 'L' for the root.

For example, for a node represented as 'V' in the decoding process at the process level 234 represented by 'i', a vector represented by 'L' of length '$2^{n-i}$' of upper instances of the soft information can be passed to the node 'V' from its parent. The vector from its parent can be 'L=($L_1,L_2$)', where '$L_1$' and '$L_2$' have the same size '$2^{n-i-1}$'.

The terms '$H_L$' and '$H_R$' can be a priori lower instances of the hard information 238 of the children of 'V'. The length of '$H_L$' and '$H_R$' can also be '$2^{n-i-1}$'. With '$V_1$' representing the first child information 214 of 'V' and '$V_2$' representing the second child information 216 of 'V'. The product of vectors can be considered as component-wise product.

The decoding module 512 can calculate the upper instance of the soft information 236 of '$V_1$', including the first child information 214 associated with the soft information 236 for the decoding process based on:

$$L_{1st}=L_1*(L_2 H_R).\qquad\text{Equation (5).}$$

The vector '$L_{1st}$' for the first child information 214 can be passed to '$V_1$'. The decoding module 512 can use a soft successive decoder, such as the successive cancellation decoder 128 of FIG. 1, to decode for the node '$V_1$' and its subtree with input '$L_{1st}$'. The operation represented by '*' can include:

$$a*b = \frac{ab+1}{a+b}.\qquad\text{Equation (6).}$$

The decoding module 512 can calculate the upper instance of the soft information 236 of '$V_2$', including the second child information 216 associated with the soft information 236 for the decoding process based on:

$$L_{end}=L_2(L_1*H'_L).\qquad\text{Equation (7).}$$

The term '$H'_L$' can represent computed vector of lower instances of the hard information 238 at or for '$V_1$'.

The vector '$L_{2nd}$' can be passed to '$V_2$'. The decoding module 512 can use the soft successive decoder to decode for the node '$V_2$' and its subtree with input '$L_{2nd}$'.

The decoding module 512 can calculate the lower instances of the soft information 236, represented as 'H', of the node 'V', based on:

$$H=[H'_L*(L_2 H'_R), H'_R(H'_L*L_1)].\qquad\text{Equation (8).}$$

The set of lower instances of the soft information 236 of 'V' can be updated. The set can be updated at the last step of the call to the soft successive decoder, such as the successive cancellation decoder 128.

For the following iteration, the soft successive decoding is implemented. The soft successive decoder can utilize stored instances of the lower instances of the soft information 236, the hard information 238, or a combination thereof from the previous iteration. The hard information of the parent can be '($H_L+H_R, H_R$)'.

Alternatively, the decoding module 512 can generate the node result 220 based on calculating the hard information 238 and the soft information 236 corresponding to the content 108 according to the first orthogonal mechanism 204, the second orthogonal mechanism 206, the further orthogonal mechanism 208, or a combination thereof. As a more specific example, the decoding module 512 can generate a first instance of the node result 220 with the first orthogonal mechanism 204.

Continuing with the example, the decoding module 512 can generate the node result 220 based on the first orthogonal mechanism 204 initially applied to the receiver signal 126, or a portion therein. The decoding module 512 can calculate the soft information 236 for the first child information 214 as discussed above, or as represented by:

$$L_{1st}=L_1*L_2.\qquad\text{Equation (9).}$$

The decoding module 512 can generate the node result 220 based on calculating the soft information 236 from the receiver signal 126 or a portion therein along the first dimension 302 according to the first orthogonal mechanism 204, as described by Equations (5) or (9).

Continuing with the example, the decoding module 512 can further refine the node result 220 based on calculating the hard information 238 along the second dimension 304 using the soft information 236 according to the second orthogonal mechanism 206 as exemplified above with Equations (5)-(8).

Continuing with the example, the decoding module 512 can process the node result 220 from the first orthogonal mechanism 204 with the second orthogonal mechanism 206. The decoding module 512 can calculate the soft information 236 for the second child information 216 as discussed above, or as represented by:

$$L_{2nd}=L_1^{1-2H_L}L_2.\qquad\text{Equation (10).}$$

The decoding module 512 can generate the further result 230 based on calculating the soft information 236 corresponding to the second child information 216. The decoding module 512 can further refine the further result 230 based on calculating the hard information 238.

Continuing with the example, the decoding module 512 can repeat the above described processes to generate the subsequent result 232. The decoding module 512 can implement a hard decision as soon as its soft information 236 is calculated when a leaf corresponds to an information bit. When the leaf does not correspond to the information bit, the decoding module 512 can implement the hard decision for a frozen zero value. The decoding module 512 can determine the content 108 originally intended for communication based on the information bits and the frozen values resulting from the second orthogonal mechanism 206 applied to the node result 220 resulting from the first orthogonal mechanism 204, from the first orthogonal mechanism 204 applied to the node result 220 from the second orthogonal mechanism 206, or a combination thereof.

The decoding module 512 can pass the soft information 236 from top of the tree architecture 202 to the bottom of thereof for the leaves. The decoding module 512 can pass the hard information 238 from the bottom of the tree architecture 202, including the leaves, to the top, or the root thereof.

As a more specific example for the decoding process, the decoding module 512 can separate or group the results of the previous instance of the process level 234 utilizing the first orthogonal mechanism 204 into halves. Alternatively, two vectors of length '$2^{n-i}$' can be assigned for the node result 220 'c' during decoding. One vector can include the soft information 236 and the other vector can include the hard information 238.

Continuing with the example, the soft information 236 can be the channel soft output if the node result 220 'c' is at the root of the tree architecture 202. Otherwise, the soft information can be passed from its parent. The hard information 238 can be the hard decision extracted from the soft information 236 when the node result 220 is at the leaf of the tree architecture 202. Otherwise, the hard information 238 can be obtained from the children of the node result 220, such as the first child information 214 and the second child information 216.

Continuing with the example, when the hard information 238 from both the first child information 214 and the second child information 216 are processed, the resulting combined instance of the hard information 238 for the subsequent instance of the process level 234 can be:

$$H = (H_{1st} + H_{2nd}, H).  \quad \text{Equation (11)}.$$

The combined instance of the hard information 238 can be assigned to the node result 220 'c' based on the hard information 238 corresponding to the first child information 214 and the second child information 216.

Continuing with the example, the soft information 236 for the node result 220 can be updated based on:

$$L_{1st} = (L_1 L_2 + 1)/(L_1 + L_2). \quad \text{Equation (12)}.$$

The second child information 216, represented as ' ', can be updated after processing the first child information 214 and obtaining the hard information 238 for the first child information 214. The second child information 216 can be based on:

$$L_{2nd} = L_1(1 - 2H_{1st}) + L_2. \quad \text{Equation (13)}.$$

The decoding module 512 can use the first orthogonal mechanism 204, the second orthogonal mechanism 206, or the further orthogonal mechanism 208 for each instance of the process level 234 of the tree architecture 202 for the multi-dimensional decoding mechanism 118. The decoding module 512 can further use the first orthogonal mechanism 204, the second orthogonal mechanism 206, or the further orthogonal mechanism 208 specific for processing the first child information 214 or the second child information 216 for the multi-dimensional decoding mechanism 118. The decoding module 512 can further use the first orthogonal mechanism 204, the second orthogonal mechanism 206, or the further orthogonal mechanism 208 specific for processing the hard information 238 or the soft information 236.

The decoding module 512 can calculate the soft information 236 for the first child information 214 corresponding to the first half for the subsequent instance of the process level 234 with the second orthogonal mechanism 206. The decoding module 512 can use a polar decoder to determine the hard information 238 for the first child information 214 based on the soft information 236.

Continuing with the example, the decoding module 512 calculate the soft information 236 for the second child information 216 corresponding to the second half for the subsequent instance of the process level 234 with the second orthogonal mechanism 206. The decoding module 512 can use a polar decoder to determine the hard information 238 for the second child information 216 based on the soft information 236.

Continuing with the example, the decoding module 512 can repeat the process alternating between the first orthogonal mechanism 204, the second orthogonal mechanism 206, the further orthogonal mechanism 208, or a combination thereof for each instance of the process level 234. The decoding module 512 can alternatively utilize the first orthogonal mechanism 204, the second orthogonal mechanism 206, the further orthogonal mechanism 208, or a combination thereof for each instance of groupings within the previous instance of the process level 234.

Continuing with the example, the decoding module 512 can repeat the process until the leaves of the tree architecture 202 are reached. The decoding module 512 can repeat the process based on the processing length 110, the coding depth 210, or a combination thereof. The decoding module 512 can generate the estimate of the content 108 as a result of decoding the receiver signal 126 or a portion therein as the resulting bits at the end of the repetitive process. The decoding module 512 can generate the estimate of the content 108 based on one or more instances of the leaf corresponding to the decoding process.

It has been discovered that the content 108 recovered based on the polar communication mechanism 112 utilizing multiple instances of the processing dimension 114 with the tree architecture 202 provides reduced processing latency for the overall communication. A total number of calls to the decoder during the decoding process can be equal to the total number of edges in the tree architecture 202 plus one for the initialization of the decoding process. The total number of recursive calls can be '2N−1'. The computing system 100 can implement component-wise operations in parallel with the vector-wise operations for the decoding process, reducing the latency of the overall process.

It has further been discovered that the content 108 recovered using the multi-dimensional decoding mechanism 118 based on applying the first orthogonal mechanism 204 to the receiver signal 126 and applying the second orthogonal mechanism 206 to resulting instance of the node result 220 provides reduced memory requirements for the overall communication. The process combining the first orthogonal mechanism 204 with the second orthogonal mechanism 206 can enable reduction memory required for the decoding process.

It has further been discovered that the content 108 recovered using the multi-dimensional decoding mechanism 118 including the successive cancellation decoder 128 provides reduced processing complexity for rate-adaptive communication achieving capacity. The decoding over multiple dimensions with the successive cancellation decoder 128 can simplify the process and reduce the total quantity of information processed with iterative cancellations.

It has further been discovered that latency can be improved where a second half or one set of bits can be decoded simultaneously with the first half or a previous set of bits for iterative soft decoding utilizing the multi-dimensional decoding mechanism 118 including the successive cancellation decoder 128. The second half of bits can use the LRs of first half of bits calculated from previous iteration, assuming old likelihood ratios for the first half of bits, instead of requiring all first half bits to be decoded initially in generating LRs for second half of bits.

It has further been discovered that utilizing the multi-dimensional decoding mechanism 118 including the successive cancellation decoder 128 can provide improved chip area management. The latency improvement can be balanced with or serve as a tradeoff with area on a chip. Due to area on chip limitations, the calculation module or circuitry can be replicated based on a parallelization factor instead of code-length. The full parallelization factor may not be obtained for some polarization steps, but can be obtained for other polarization steps.

The computing system 100 can implement the polar communication mechanism 112 including the combined-iterative mechanism 130 of FIG. 1, the list decoding mechanism 132 of FIG. 1, or a combination thereof. The computing system 100 can implement the polar communication mechanism 112 including the combined-iterative mechanism 130 according to a feedback between the decoding module 512 and the detection module 510.

The computing system 100 can utilize the soft information 236 from the detection module 510, the decoding module 512, or a combination thereof to decode the signal. For example, for each iteration, the soft information in the root of the tree architecture 202 can be used as a priori information for demodulating the symbols for the detection module 510. Also for example, the soft information 236 for the bit at the process level 234 below the root of the tree architecture 202 can be passed as the a priori information for demodulating and detecting the symbols for the detection module 510.

For example, the decoding module 512 can calculate multiple instances of the soft information 236, represented as '$L_1$', '$L_2$', and '$L_3$', corresponding to multiple portions of the receiver signal 126, represented as '$y_1$', '$y_2$', and '$y_3$'. As a more specific example, the computing system 100 can utilize and process for a specific instance of 'G' for a 3×3 matrix including first row of [1 0 0], second row of [1 1 0], and third row of [0 1 1].

Continuing with the example, the decoding module 512 can further calculate multiple instances of the hard information 238 from the other side of the building block, represented as '$H_1$', '$H_2$', and '$H_3$', corresponding to the multiple portions of the receiver signal 126. Independent observations '$z_1$', '$z_2$', and '$z_3$' of '$u_1$', '$u_2$', and $u_3$ for the transmitter signal 122 with hard information 238 '$H_1$', '$H_2$', and '$H_3$' can be available at the output.

Continuing with the example, the decoding module 512 can calculate the soft information 236 including the first LR corresponding to '$u_1$' based on:

$$P\{y_1^3, z_2, z_3 | u_1\} = \sum_{u_2,u_3} P\{y_1^3, z_2, z_3, u_2, u_3 | u_1\} = \qquad \text{Equation (14)}$$

$$\frac{1}{4} \sum_{u_2,u_3} P\{y_1^3, z_2, z_3 | u_1^3\}$$

$$= \frac{1}{4} \sum_{u_2,u_3} W(y_1 | u_1 + u_2)$$

$$W(y_2 | u_2 + u_3) W(y_3 | u_3) P(z_2 | u_2) P(z_3 | u_3).$$

The decoding module 512 can calculate the first instance of the soft information 236 including the LR based on:

$$\frac{P\{y_1^3, z_2, z_3 | u_1 = 0\}}{P\{y_1^3, z_2, z_3 | u_1 = 1\}} = \frac{L_1 L_2 L_3 H_2 H_3 + L_1 H_2 + L_3 H_3 + L_2}{L_2 L_3 H_2 H_3 + H_2 + L_1 L_3 H_3 + L_1 L_2}. \qquad \text{Equation (15)}$$

Continuing with the example, the likelihood ratio of ' ' can be calculated based on:

$$P\{y_1^3, z_1, z_3 | u_2\} = \sum_{u_1,u_3} P\{y_1^3, z_1, z_3, u_1, u_3 | u_1\} = \qquad \text{Equation (16)}$$

$$\frac{1}{4} \sum_{u_2,u_3} P\{y_1^3, z_1, z_3 | u_1^3\}$$

$$= \frac{1}{4} \sum_{u_1,u_3} W(y_1 | u_1 + u_2)$$

$$W(y_2 | u_2 + u_3)$$

$$W(y_3 | u_3) P(z_1 | u_1) P(z_3 | u_3).$$

The decoding module 512 can calculate the second instance of the soft information 236 including the LR based on:

$$\frac{P\{y_1^3, z_1, z_3 | u_2 = 0\}}{P\{y_1^3, z_1, z_3 | u_2 = 1\}} = (L_1 * H_1)(L_2 * L_3 H_3). \qquad \text{Equation (17)}$$

The decoding module 512 can further calculate the third instance of the soft information 236 including the LR based on:

$$\frac{P\{y_1^3, z_1, z_2 | u_3 = 0\}}{P\{y_1^3, z_1, z_2 | u_3 = 1\}} = (L_2 * H_2) L_3. \qquad \text{Equation (18)}$$

It has been discovered that the multi-dimensional decoding mechanism 118 including the combined-iterative mechanism 130 provides increased flexibility and improved error rates. The combined-iterative mechanism 130 can allow for polar compound coding for the computing system 100. The feedback between decoding and detection module 510 can further be used as a priori information and reduce possible errors.

The computing system 100 can further implement the polar communication mechanism 112 including the list decoding mechanism 132. The decoding module 512 can utilize the list decoding mechanism 132 along with the successive cancellation decoder 128. The decoding module 512 can utilize the list decoding mechanism 132 along with or in place of the tree architecture 202.

The list decoding mechanism 132 can call the successive cancellation decoder functions recursively for all nodes in the binary tree structure therein. For example, decoding for a polar code of length 'N=2$^m$' and the coding depth 210 of 'n' can be discussed. In the regular successive cancellation decoder, each of the vectors '$L_1$', '$L_2$', '$H_{1st}$', and '$H_{2nd}$' can be $$'L \times \frac{N}{2}'$$

vectors instead of $$'1 \times \frac{N}{2}'.$$

The term '($L_1$, $L_2$)' can represent the soft information 236 including LLR value at the root of the tree architecture 202. The terms '$H_1$' and '$H_2$' can represent the hard information 238 generated corresponding to the first child information 214 and the second child information 216.

The decoding module 512 implementing the list decoding mechanism 132 can process the first child information 214 and the second child information 216 consecutively. While processing the second child information 216, the labels of the paths can change. Some instances may be removed or deleted, while some other instances can be cloned. The decoding module 512 can track the path labels and combine the hard information 238 from the first child information 214 and the second child information 216 accordingly using function 'π'.

The decoding module 512 can implement the list decoding mechanism 132 based on:

$$L_{2nd} = \pi'(L_1) \cdot *(1 - 2H_1) + L_2. \qquad \text{Equation (19).}$$

The operation '.*' can represent element-wise multiplication. The decoding module 512 can use the function 'π'' to remove some rows of '$L_1$'. The decoding module 512 can use the function 'π' to further make multiple copies of the other rows and arrange the rows in sequence. The decoding module 512 can further implement the list decoding mechanism 132 based on:

$$[\pi(H_{1st}) \oplus H_{2nd} H_{2nd}]. \qquad \text{Equation (20).}$$

It has been discovered that the multi-dimensional decoding mechanism 118 including the list decoding mechanism 132 provides decreased decoding latency while maintaining decoding complexity. The reduction in latency can be based on all the operation for different decoding baths being implemented independently and in parallel with each other by the decoding module 512 based on the structure of the list decoding mechanism 132.

Figure 6:
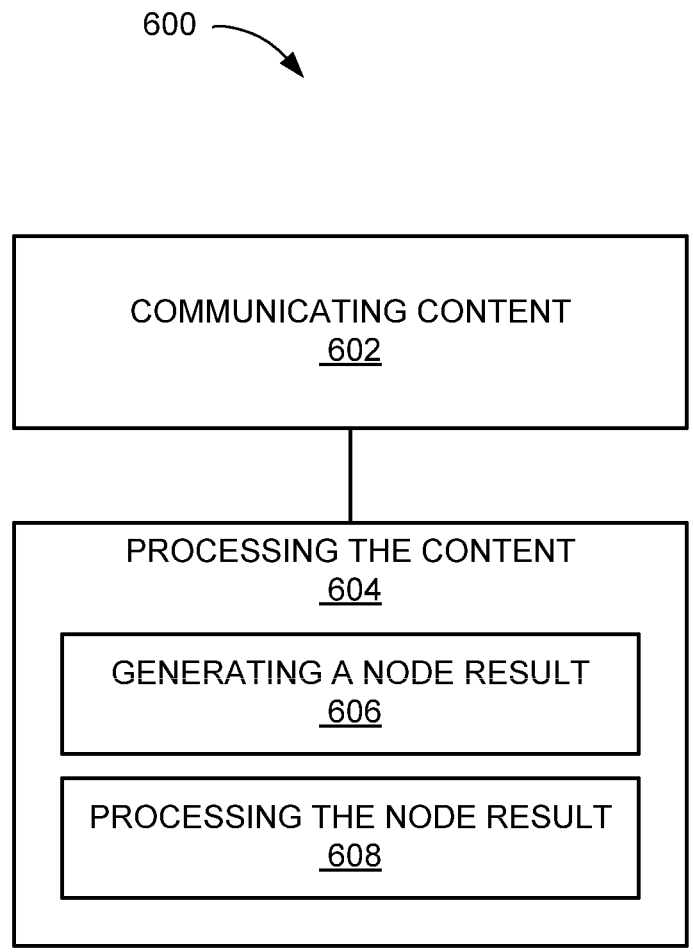
FIG. 6 is a flow chart of a method of operation of a computing system in a further embodiment of the present invention.

Referring now to FIG. 6, therein is shown a flow chart 600 of a method of operation of a computing system in a further embodiment of the present invention. The method 600 includes: communicating content in a block 602; and processing the content based on the polar communication mechanism utilizing multiple processing dimensions for communicating the content in a block 604. The method 600 can further include generating a node result with a first orthogonal mechanism in a box 606 and processing the node result from the first orthogonal mechanism with a second orthogonal mechanism in a box 608.

The modules described in this application can be hardware implementation or hardware accelerators, including passive circuitry, active circuitry, or both, in the first communication unit 416 of FIG. 4, the second communication unit 436 of FIG. 4, the first control unit 412 of FIG. 4, the second control unit 438 of FIG. 4, or a combination thereof. The modules can also be hardware implementation or hardware accelerators, including passive circuitry, active circuitry, or both, within the first device 102 of FIG. 1, the second device 106 of FIG. 1, or a combination thereof but outside of the first communication unit 416, the second communication unit 436, the first control unit 412, the second control unit 434, or a combination thereof.

The computing system 100 of FIG. 1 has been described with module functions or order as an example. The computing system 100 can partition the modules differently or order the modules differently. For example, the dimensional processing module 514 of FIG. 4 and the orthogonal processing module 516 of FIG. 4 can be combined into one module. Also for example, the decoding module 512 can be implemented as separate modules each for different orthogonal processing.

For illustrative purposes, the various modules have been described as being specific to the first device 102, the second device 106, or a combination thereof. However, it is understood that the modules can be distributed differently. For example, the various modules can be implemented in a different device, or the functionalities of the modules can be distributed across multiple devices. As a more specific example, one or more of the modules in FIG. 4 can be included in the first device 102, the second device 106, or a combination thereof, spread out and shared across the devices, or implemented in one or few of the devices coordinating for the group of devices.

Also as an example, the various modules can be stored in a non-transitory memory medium. As a more specific example, one or more modules described above can be stored in the non-transitory memory medium for distribution to a different system, a different device, a different user, or a combination thereof, for manufacturing, or a combination thereof. Also as a more specific example, the modules described above can be implemented or stored using a single hardware unit, such as a chip or a processor, or across multiple hardware units.

The modules described in this application can be stored in the non-transitory computer readable medium. The first communication unit 216, the second communication unit 236, the first control unit 212, the second control unit 234, the first storage unit 214 of FIG. 2, the second storage unit 246 of FIG. 2, or a combination thereof can represent the non-transitory computer readable medium. The first communication unit 216, the second communication unit 236, the first control unit 212, the second control unit 234, the first storage unit 214, the second storage unit 246, or a combination thereof, or a portion therein can be removable from the first device 102, the second device 106, or a combination thereof. Examples of the non-transitory computer readable medium can be a non-volatile memory card or stick, an external hard disk drive, a tape cassette, or an optical disk.

The physical transformation of the content 108 of FIG. 1 to the code word 120 of FIG. 1 based on the multi-dimensional encoding mechanism 116 of FIG. 1 and recovery of the content 108 based on the multi-dimensional encoding mechanism 118 of FIG. 1 results in the movement in the physical world, such as the content 108 displayed or recreated for the user on the receiving from processing the coordinated components of the receiver signal 126 of FIG. 1 corresponding to the encoding and decoding process. The reproduced content data, such as navigation information or voice signal of a caller, can influence the user's movement, such as following the navigation information or replying back to the caller. Movement in the physical world results in changes to the channel characterization, the geographic location of the receiving device, or a combination thereof, which can be fed back into the computing system 100 and influence the node result 220 of FIG. 2 for the multi-dimensional encoding mechanism 116, the multi-dimensional decoding mechanism 118, or a combination thereof.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computing system comprising:
an inter-device interface configured to communicate content; and
a communication unit, coupled to the inter-device interface, configured to process the content based on a polar coding mechanism utilizing multiple processing dimensions for providing error correcting code based on polarizing one or more channels in communicating the content, including:
generating a node result with a first orthogonal mechanism, and
processing the node result from the first orthogonal mechanism with a second orthogonal mechanism.

2. The system as claimed in claim 1 wherein:
the communication unit is configured to implement a multi-dimensional encoding mechanism to generate code word for processing the content including:
generating the node result based on the first orthogonal mechanism applied to the content,
generating the code word based on the second orthogonal mechanism applied to the node result; and
the inter-device interface is configured to transmit transmitter signal corresponding to the code word for communicating the content.

3. The system as claimed in claim 1 wherein:
the inter-device interface is configured to receive receiver signal for representing the content; and
the communication unit is configured to implement a multi-dimensional decoding mechanism to decode the receiver signal including:
generating the node result based on the first orthogonal mechanism applied to the receiver signal, and
determining the content based on the second orthogonal mechanism applied to the node result.

4. The system as claimed in claim 1 wherein the communication unit is configured to generate the node result based on first child information and second child information according to the first orthogonal mechanism, the second orthogonal mechanism, or a combination thereof.

5. The system as claimed in claim 1 wherein the communication unit is configured to generate the node result based on calculating hard information and soft information corresponding to the content according to the first orthogonal mechanism, the second orthogonal mechanism, or a combination thereof.

6. The system as claimed in claim 1 wherein the communication unit is configured to:
implement the first orthogonal mechanism corresponding to a first dimension; and
implement the second orthogonal mechanism corresponding to a second dimension orthogonal to the first orthogonal mechanism.

7. The system as claimed in claim 6 wherein the communication unit is configured to implement a multi-dimensional encoding mechanism to generate code word for processing the content including first content portion, second content portion, third content portion, and fourth content portion based on:
generating the node result based on combining the first content portion and the second content portion according to the first orthogonal mechanism;
generating a further result based on combining the third content portion and the fourth content portion according to the first orthogonal mechanism; and
generating a subsequent result representing the code word based on combining the node result and the further result from the first orthogonal mechanism according to the second orthogonal mechanism.

8. The system as claimed in claim 6 wherein the communication unit is configured to implement a multi-dimensional decoding mechanism to decode the receiver signal including:
generating the node result based on calculating soft information from the receiver signal along the first dimension according to the first orthogonal mechanism;
refining the node result based on calculating hard information or calculating a further instance of the soft information along the second dimension using the soft information according to the second orthogonal mechanism; and
determining the content based on the node result resulting from the first orthogonal mechanism and the second orthogonal mechanism.

9. The system as claimed in claim 6 wherein the communication unit is configured to generate the node result based on a Kronecker power corresponding to a process level associated with the first orthogonal mechanism, the second orthogonal mechanism, or a combination thereof utilized for generating the node result.

10. The system as claimed in claim 6 wherein the communication unit is configured to implement the polar coding mechanism including a tree architecture, a successive cancellation decoder, a combined-iterative mechanism, a list decoding mechanism, or a combination thereof.

11. A method of operation of a computing system comprising:
communicating content; and
processing with communication nit the content based on a polar coding mechanism utilizing multiple processing dimensions for communicating the content, including:
generating a node result with a first orthogonal mechanism, and
processing the node result from the first orthogonal mechanism with a second orthogonal mechanism.

12. The method as claimed in claim 11 wherein:
processing the content includes implementing a multi-dimensional encoding mechanism to generate code word for processing the content including:
generating the node result based on the first orthogonal mechanism applied to the content,
generating the code word based on the second orthogonal mechanism applied to the node result; and
communicating the content includes transmitting transmitter signal corresponding to the code word for communicating the content.

13. The method as claimed in claim 11 wherein:
communicating the content includes receiving receiver signal for representing the content; and
processing the content includes implementing a multi-dimensional decoding mechanism to decode the receiver signal including:
generating the node result based on the first orthogonal mechanism applied to the receiver signal, and
determining the content based on the second orthogonal mechanism applied to the node result.

14. The method as claimed in claim 11 wherein generating the node result includes generating the node result based on first child information and second child information according to the first orthogonal mechanism, the second orthogonal mechanism, or a combination thereof.

15. The method as claimed in claim 11 wherein generating the node result includes generating the node result based on calculating hard information and soft information corresponding to the content according to the first orthogonal mechanism, the second orthogonal mechanism, or a combination thereof.

16. A non-transitory computer readable medium including instructions for a computing system comprising:
communicating content; and
processing the content based on a polar coding mechanism utilizing multiple processing dimensions for communicating the content, including:
generating a node result with a first orthogonal mechanism, and
processing the node result from the first orthogonal mechanism with a second orthogonal mechanism.

17. The non-transitory computer readable medium as claimed in claim 16 wherein:
processing the content includes implementing a multi-dimensional encoding mechanism to generate code word for processing the content including:
generating the node result based on the first orthogonal mechanism applied to the content,
generating the code word based on the second orthogonal mechanism applied to the node result; and
communicating the content includes transmitting transmitter signal corresponding to the code word for communicating the content.

18. The non-transitory computer readable medium as claimed in claim 16 wherein:
communicating the content includes receiving receiver signal for representing the content; and
processing the content includes implementing a multi-dimensional decoding mechanism to decode the receiver signal including:
generating the node result based on the first orthogonal mechanism applied to the receiver signal, and
determining the content based on the second orthogonal mechanism applied to the node result.

19. The non-transitory computer readable medium as claimed in claim 16 wherein generating the node result includes generating the node result based on first child information and second child information according to the first orthogonal mechanism, the second orthogonal mechanism, or a combination thereof.

20. The non-transitory computer readable medium as claimed in claim 16 wherein generating the node result includes generating the node result based on calculating hard information and soft information corresponding to the content according to the first orthogonal mechanism, the second orthogonal mechanism, or a combination thereof.

* * * * *

UNITED STATES PATENT AND TRADEMARK OFFICE
CERTIFICATE OF CORRECTION

PATENT NO. : 9,602,241 B2
APPLICATION NO. : 14/485598
DATED : March 21, 2017
INVENTOR(S) : Hessam Mahdavifar et al.

Page 1 of 1

It is certified that error appears in the above-identified patent and that said Letters Patent is hereby corrected as shown below:

In the Claims

Column 38, Claim 11, Line 32, delete "with communication nit" and insert therefor --with a communication unit--

Signed and Sealed this
Fourth Day of August, 2020

Andrei Iancu
*Director of the United States Patent and Trademark Office*